(12) United States Patent
Chang et al.

(10) Patent No.: US 10,044,326 B2
(45) Date of Patent: Aug. 7, 2018

(54) METHOD OF GENERATING A PULSE WIDTH MODULATION (PWM) SIGNAL FOR AN ANALOG AMPLIFIER, AND A RELATED PULSE WIDTH MODULATOR

(71) Applicant: Nanyang Technological University, Singapore (SG)

(72) Inventors: Joseph Sylvester Chang, Singapore (SG); Tong Ge, Singapore (SG); Linfei Guo, Singapore (SG)

(73) Assignee: Nanyang Technological University, Singapore (SG)

( * ) Notice: Subject to any disclaimer, the term of this patent is extended or adjusted under 35 U.S.C. 154(b) by 124 days.

(21) Appl. No.: 14/914,768

(22) PCT Filed: Oct. 10, 2014

(86) PCT No.: PCT/SG2014/000476
§ 371 (c)(1),
(2) Date: Feb. 26, 2016

(87) PCT Pub. No.: WO2015/053714
PCT Pub. Date: Apr. 16, 2015

(65) Prior Publication Data
US 2016/0211809 A1    Jul. 21, 2016

Related U.S. Application Data

(60) Provisional application No. 61/889,794, filed on Oct. 11, 2013.

(51) Int. Cl.
*H03F 1/32*    (2006.01)
*H03F 3/187*   (2006.01)
(Continued)

(52) U.S. Cl.
CPC ............ *H03F 1/3211* (2013.01); *G11C 27/02* (2013.01); *H03F 3/183* (2013.01); *H03F 3/187* (2013.01);
(Continued)

(58) Field of Classification Search
CPC ...................................................... H03F 1/3211
(Continued)

(56) References Cited

U.S. PATENT DOCUMENTS 9,263,992 B1 *    2/2016   Breece, III ............ H03F 1/0205
2006/0044057 A1 * 3/2006   Hezar ....................... H03F 1/34
                                                              330/10
(Continued)

OTHER PUBLICATIONS

Adrian et al "A Low-Voltage Micropower Digital Class-D Amplifier Modulator for Hearing Aids" IEEE Transactions on Circuits and Systems 1: Regular Papers vol. 56, pp. 337-349, 2009.
(Continued)

*Primary Examiner* — Patricia T Nguyen
(74) *Attorney, Agent, or Firm* — Cesari and McKenna, LLP; James A. Blanchette

(57) ABSTRACT

A method (300) of generating a pulse width modulation (PWM) signal for an analog amplifier, the amplifier arranged to receive an amplifier input signal having a magnitude, is disclosed. The method comprises receiving (302) a modulator input signal, which is associated with the amplifier input signal; and using (304) the modulator input signal to modulate a carrier to produce the PWM signal, wherein the carrier's frequency varies in dependence on the magnitude of the amplifier input signal. A related pulse width modulator is also disclosed.

15 Claims, 21 Drawing Sheets

(51) Int. Cl.
*H03F 3/217* (2006.01)
*H03F 3/45* (2006.01)
*G11C 27/02* (2006.01)
*H03F 3/183* (2006.01)
*H03K 7/08* (2006.01)

(52) U.S. Cl.
CPC .......... *H03F 3/217* (2013.01); *H03F 3/2171* (2013.01); *H03F 3/2173* (2013.01); *H03F 3/2175* (2013.01); *H03F 3/45475* (2013.01); *H03K 7/08* (2013.01); *H03F 2200/03* (2013.01); *H03F 2200/129* (2013.01); *H03F 2200/351* (2013.01); *H03F 2200/411* (2013.01); *H03F 2203/45512* (2013.01); *H03F 2203/45526* (2013.01); *H03F 2203/45528* (2013.01)

(58) Field of Classification Search
USPC .................................................. 330/251, 10
See application file for complete search history.

(56) References Cited

U.S. PATENT DOCUMENTS

| | | | | |
|---|---|---|---|---|
| 2006/0103362 | A1* | 5/2006 | Eberlein | H03M 1/50 323/282 |
| 2006/0208793 | A1* | 9/2006 | Morishima | H03F 1/26 330/10 |
| 2007/0096812 | A1* | 5/2007 | Lee | H03F 1/26 330/251 |
| 2011/0043283 | A1* | 2/2011 | Huang | H03F 3/217 330/207 A |

OTHER PUBLICATIONS

Choi et al "A 0.018% THD+N, 88-dB PSRR PWM Class-D Amplifier for Direct Battery Hookup" IEEE Journal of Solid-State Circuits vol. 47, pp. 454-463, 2012.

Ge et al "Bang-Bang Control Class-D Amplifiers: Power-Supply Noise" IEEE Transactions on Circuits and Systems II: Express Briefs vol. 55, pp. 723-727, 2008.

Ge et al "Bang-Bang Control Class D Amplifiers: Total Harmonic Distortion and Supply Noise" IEEE Transactions on Circuits and Systems I: Regular Papers vol. 56, pp. 2353-2361, 2009.

Lu et al "Design and Analysis of a Self-Oscillating Class D Audio Amplifier Employing a Hysteretic Comparator" IEEE Journal of Solid-State Circuits vol. 46, pp. 2336-2349, 2011.

Matamura et al "Filterless Multi-Level Delta-Sigma Class-D Amplifier for Portable Applications" IEEE International Symposium on Circuits and Systems, pp. 1177-1180, 2009.

Nagari et al "An 8Ω 2.5W 1%-THD 104dB(A)-Dynamic-Range Class-D Audio Amplifier with an Ultra-Low EMI System and Current Sensing for Speaker Protection" IEEE International Solid-State Circuits Conference, pp. 92-94, 2012.

Rojas-Gonzalez et al "Two Class-D Audio Amplifiers with 89/90% Efficiency and 0.02/0.03% THD+N Consuming Less than 1mW of Quiescent Power" IEEE International Solid-State Circuits Conference, pp. 450-452, 2009.

Shu et al "IMD of Closed-Loop Filterless Class D Amplifiers" IEEE Transactions on Circuits and Systems I: Regular Papers vol. 57, pp. 518-527, 2010.

Shu et al "Power Supply Noise in Analog Audio Class D Amplifiers" IEEE Transactions on Circuits and Systems I: Regular Papers vol. 56, pp. 84-96, 2009.

Shu et al "THD of Closed-Loop Analog PWM Class-D Amplifiers" IEEE Transactions on Circuits and Systems I: Regular Papers vol. 55, pp. 1769-1777, 2008.

Teplechuk et al "Filterless Integrated Class-D Audio Amplifier Achieving 0.0012% THD+N and 96dB PSRR When Supplying 1.2W" IEEE International Solid-State Circuits Conference, pp. 240-242, 2011.

* cited by examiner

2500

3200

| References | this work | [29] | [17] | [28] | [22] | [21] | [20] | [19] | [18] |
|---|---|---|---|---|---|---|---|---|---|
| Package Type | Lead-Frame | | | | | Wafer-Level CSP | | | |
| PSRR@217 Hz | 101 | 77 | 88 | 82 | 70 | 96 | 72.2 | 82 | 66 |
| THD+N@1 kHz (%) | 0.0027 | 0.02 | 0.018 | 0.02 | 0.0012 | 0.0012 | 0.028 | 0.04 | 0.004 |
| SNR | 97 | 94 | 92 | 100 | 116.5 | 103 | 97.5 | 103 | 103 |
| Efficiency % | 94 | 89 | 85.5 | 84 | 84.5 | 93 | 90.9 | 93 | 93 |
| Pout max (W) @ THD+N=1% (8Ω) | 0.85 | 0.25 | 1.15 | 0.35 | 1.45 | 3.6 | 0.725 | 1.8 | 1.84 |
| Supply (V) | 1.2-4 | 2.7 | 2.7-4.9 | 2.7 | 5 | 2.5-5.5 | 2.7-5.2 | 2.5-5.5 | 2.2-5.5 |
| Single Cell (1.2V) Operation | Yes | No | No | No | No | No | No | No | No |
| $I_q$ (mA) | 3.1 | 0.25 | 3.02 | 0.55 | 24* | 4 | 2 | 1.5 | 3.2 |
| Load (Ω) | 8 | 8 | 8 | 8 | 8 | 4 or 8 | 8 | 4 | 4 |
| Architecture# | PWM | SMC | PWM | SMC | SMC | UPWM | PWM | PWM | ΔΣ |
| Switching (kHz) | 320 | 450 | 320 | 380 | 600 | 1000 | 420 | 300 | 280 |
| Process | 65nm | 0.5μm | 0.18μm | 0.5μm | 0.7μm | 0.25μm | 0.18μm | - | - |
| Area (mm²) | 1.69 | 1.49 | 1.01 | 1.65 | 6 | 1.44 | 1.14 | 1.41 | 2.2 |
| Package | QFN | QFP | LQFP | DIP | QFP | WLCSP | WLCSP | WLCSP | WLCSP |

SMC = Sliding Mode Control; UPWM = Uniform PWM; ΔS = Sigma-Delta Modulation
* The quiescent current is estimated from [22]

FIG. 21

METHOD OF GENERATING A PULSE WIDTH MODULATION (PWM) SIGNAL FOR AN ANALOG AMPLIFIER, AND A RELATED PULSE WIDTH MODULATOR

CROSS REFERENCE TO RELATED APPLICATIONS

This application is the National Stage of International Application No. PCT/SG2014/000476, filed on Oct. 10, 2014, which claims the benefit of U.S. Provisional Application No. 61/889,794, filed on Oct. 11, 2013. The contents of both applications are hereby incorporated by reference in their entirety.

FIELD

The present invention relates to a method of generating a pulse width modulation (PWM) signal for an analog amplifier and a related pulse width modulator.

BACKGROUND

Smart mobile devices, including smartphones and tablets, continue to evolve with increased data communication rate, improved visual (screen/display) resolution and increased auditory (audio/sound) fidelity. In case of audio fidelity, several modern smart mobile devices claim very high fidelity due to incorporation of a 24-bit 192 kHz digital-to-analog converter (DAC), possibly with Signal-to-Noise Ratio, SNR>100 dB, Dynamic Range>100 dB and Total Harmonic Distortion+Noise (i.e. THD+N) of the order of 0.002% [13-15]. To ensure that these smart devices retain their overall (system) audio fidelity, the audio amplifier embodied therein likewise needs to feature commensurate high fidelity, including THD+N of the same order. Further, due to inevitable noise coupling between different modules (including said digital-to-analog converter) in the audio CODEC System-on-Chip, the said audio amplifier therein also needs to feature very high tolerance to noise in the supply rail (as qualified by high Power Supply Rejection Ratio (PSRR), for example PSRR>>80 dB, and low Power Supply induced Intermodulation Distortion (PS-IMD) [16, 17], for example PS-IMD<−90 dB), and low Electromagnetic Interference (EMI). Yet further, in view of the limited power resources in these mobile smart devices, it is highly desirable that said amplifier features high power-efficiency, for example power-efficiency, η>90%.

In view of the high power-efficiency requirement, it is not surprising that virtually all modern smart mobile devices embody a Class D Amplifier (CDA) [18-20] as the driver to a primary ('speakerphone') loudspeaker due to the unparalleled higher power-efficiency characteristics of CDAs over their linear counterparts. Nevertheless, CDAs are largely deficient in fidelity and noise immunity (to power supply noise). Specifically, CDAs typically suffer from drawbacks [1-4, 9-12] such as having relatively higher distortion, susceptibility to PSRR, and EMI in some cases. Existing methods adopted to mitigate the above drawbacks include, amongst others, employing a high carrier frequency ($f_{sw}$) [5, 6], and/or adopting complex multiple feedback loops [7].

Unfortunately, those methods also undesirably have severe compromises. For example, using a high carrier frequency not only increases power dissipation of the amplifiers (hence reducing power-efficiency) but also increases the EMI emitted [8]. On the other hand, using complex multiple feedback loops increase both hardware complexity (thus necessitating a higher IC area for the necessary circuitries, with a corresponding increase in related costs) and quiescent power dissipation of the amplifiers (hence reducing power-efficiency). Consequently the CDAs may be rendered non-fully-integrated, if external components are also required.

Further, it is to be appreciated that existing CDAs are unable to provide attributes which qualify as "very-high-quality" (i.e. having THD+N<−80 dB and PSRR>80 dB) in the form of a non-Flip-Chip package, or as "ultra-high-quality" (i.e. having THD+N<−100 dB and PSRR>100 dB) in the form of a Flip-Chip or a non-Flip-Chip package. In this respect, it is thus accepted within the audio amplifiers and electronics (e.g. smartphone, tablet manufacturers and etc.) industries that there is a demand for CDAs with "very-high-quality" and/or "ultra-high-quality" attributes.

One object of the present invention is therefore to address at least one of the problems of the prior art and/or to provide a choice that is useful in the art.

SUMMARY

According to a $1^{st}$ aspect of the invention, there is provided a method of generating a pulse width modulation (PWM) signal for an analog amplifier, the amplifier being arranged to receive an amplifier input signal having a magnitude. The method comprises: (i) receiving a modulator input signal, which is associated with the amplifier input signal; and (ii) using the modulator input signal to modulate a carrier to produce the PWM signal; wherein the carrier's frequency varies in dependence on the magnitude of the amplifier input signal.

Advantageously, the method enables a lower THD+N at large magnitude of an amplifier input signal to be achieved without compromising the THD+N performance at small magnitude of the amplifier input signal. Also, the method improves on the PSRR performance of the amplifier since a higher loop-gain may be used for large magnitude of the amplifier input signal, without compromising linearity/dynamic-range. Further, usage of the method leads to an improvement of the overall power-efficiency of the amplifier.

Preferably, the method may further comprise varying magnitude of a current to vary the carrier's frequency, the current's magnitude being dependent on the magnitude of the amplifier input signal.

Preferably, wherein the PWM signal includes a series of pulses, the method may further comprise adjusting the pulses of the PWM signal to produce a phase-adjusted PWM signal, the phase-adjusted PWM signal including a series of phase-adjusted pulses with each phase-adjusted pulse defined by a pair of changing edges and a pulse centre, the pulse centre of each phase-adjusted pulse being fixed relative to a respective centre of the carrier, and with one of the changing edges being synchronised to a triggering edge of the PWM signal.

The pulse centre of each phase-adjusted pulse may be in registration with the respective centre of the carrier. Also, the fixed relative position between the pulse centre of each phase-adjusted pulse and the respective centre of the carrier may preferably include a constant time delay which is independent of the magnitude of the input signal.

Preferably, the method may further comprise using the PWM signal as a clock signal for sampling the modulator input signal to produce a sampled signal; and comparing the sampled signal with the carrier to produce the phase-adjusted PWM signal.

Preferably, the method may further comprise using the PWM signal as a clock signal for sampling the modulator input signal to produce a sampled signal; comparing the sampled signal with the carrier to produce an intermediate PWM signal; and combining the intermediate PWM signal with the PWM signal to produce the phase-adjusted PWM signal.

Preferably, the method may further comprise generating a carrier pulse signal based on the carrier; generating a half-pulse signal based on the carrier pulse signal and the PWM signal, the half-pulse signal having a series of reduced-width-pulses; and doubling the width of each of the reduced-width-pulses to produce the phase-adjusted PWM signal.

According to a $2^{nd}$ aspect of the invention, there is, provided a pulse width modulator for generating a pulse width modulation (PWM) signal for an analog amplifier, the amplifier being arranged to receive an amplifier input signal having a magnitude. The pulse width modulator comprises a modulator input for receiving a modulator input signal, which is associated with the amplifier input signal; and a modulator for modulating a carrier with the modulator input signal to produce the PWM signal, wherein the carrier's frequency varies in dependence on the magnitude of the amplifier input signal.

Preferably, the modulator may include at least one comparator configured to modulate the carrier with the modulator input signal to produce the PWM signal.

Yet preferably, wherein the PWM signal includes a series of pulses, the modulator may further comprise a pulse circuit for adjusting the pulses of the PWM signal to produce a phase-adjusted PWM signal, the phase-adjusted PWM signal including a series of phase-adjusted pulses with each phase-adjusted pulse defined by a pair of changing edges and a pulse centre, the pulse centre of each phase-adjusted pulse being fixed relative to a respective centre of the carrier, and with one of the changing edges being synchronised to a triggering edge of the PWM signal.

According to a $3^{rd}$ aspect of the invention, there is provided a method of generating a phase-adjusted pulse width modulation (PWM) signal for an analog amplifier, the amplifier being arranged to receive an amplifier input signal. The method comprises: (i) receiving a modulator input signal, which is associated with the amplifier input signal; (ii) using the modulator input signal to modulate a carrier to produce a PWM signal having a series of pulses; and (iii) adjusting the pulses of the PWM signal to produce the phase-adjusted PWM signal, the phase-adjusted PWM signal including a series of phase-adjusted pulses with each phase-adjusted pulse defined by a pair of changing edges and a pulse centre, the pulse centre of each phase-adjusted pulse being fixed relative to a respective centre of the carrier, and with one of the changing edges being synchronised to a triggering edge of the PWM signal.

Advantageously, the method allows phase-error of the PWM signal to be significantly reduced, at only a slight increase in duty-cycle-error, which is largely inconsequential since a high loop-gain may be used to reduce said duty-cycle-error. Moreover, usage of the method enables the amplifier to attain a much lower THD+N at high input frequencies, and also improves on the PSRR performance of the amplifier since a high loop-gain may be used without compromising the THD+N at high input frequencies.

Preferably, the pulse centre of each phase-adjusted pulse may be in registration with the respective centre of the carrier.

Preferably, the fixed relative position between the pulse centre of each phase-adjusted pulse and the respective centre of the carrier may include a constant time delay which is independent of the magnitude of the input signal.

According to a $4^{th}$ aspect of the invention, there is provided a pulse width modulator for generating a phase-adjusted pulse width modulation (PWM) signal for an analog amplifier, the amplifier being arranged to receive an amplifier input signal. The modulator, comprises: (i) a modulator input for receiving a modulator input signal, which is associated with the amplifier input signal; (ii) a modulator for modulating a carrier with the modulator input signal to produce a PWM signal having a series of pulses, and (iii) pulse circuit for adjusting the pulses of the PWM signal to produce the phase-adjusted PWM signal, the phase-adjusted PWM signal including a series of phase-adjusted pulses with each phase-adjusted pulse defined by a pair of changing edges and a pulse centre, the pulse centre of each phase-adjusted pulse being fixed relative to a respective centre of the carrier, and with one of the changing edges being synchronised to a triggering edge of the PWM signal.

Preferably, the pulse centre of each phase-adjusted pulse may be in registration with the respective centre of the carrier.

Preferably, the fixed relative position between the pulse centre of each phase-adjusted pulse and the respective centre of the carrier may include a constant time delay which is independent of the magnitude of the input signal.

Preferably, the modulator may include at least a first comparator configured to modulate the carrier with the modulator input signal to produce the PWM signal.

Preferably, the modulator may further include at least one sample-and-hold device arranged to receive signals from the first comparator, and a second comparator arranged to receive signals from the sample-and-hold device.

Preferably, the second comparator may be arranged to produce the phase-adjusted PWM signal.

Yet preferably, the modulator may further include at least a pulse combining circuit arranged to receive signals from the first and second comparators to produce the phase-adjusted PWM signal.

Preferably, the modulator may further include at least one half pulse generator arranged to receive signals from the first comparator, and at least one pulse doubler arranged to receive signals from the half pulse generator to produce the phase-adjusted PWM signal.

According to a $5^{th}$ aspect of the invention, there is provided an analog amplifier comprising the pulse width modulator provided in the relevant foregoing aspects.

Preferably, the analog amplifier may be a Class D analog amplifier. The analog amplifier may also further comprise an integrator and filter circuit arranged to filter the amplifier input signal to produce the modulator input signal. Yet preferably, the analog amplifier may further comprise a carrier generator arranged to generate the carrier.

Preferably, the analog amplifier may further comprise another identical pulse width modulator, wherein the said two pulse width modulators are in a parallel arrangement.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 21 is a table benchmarking performance for the amplifier of FIG. 11a against conventional CDAs.

DETAILED DESCRIPTION OF PREFERRED EMBODIMENTS

1. Signal-Modulated PWM

Figure 1:
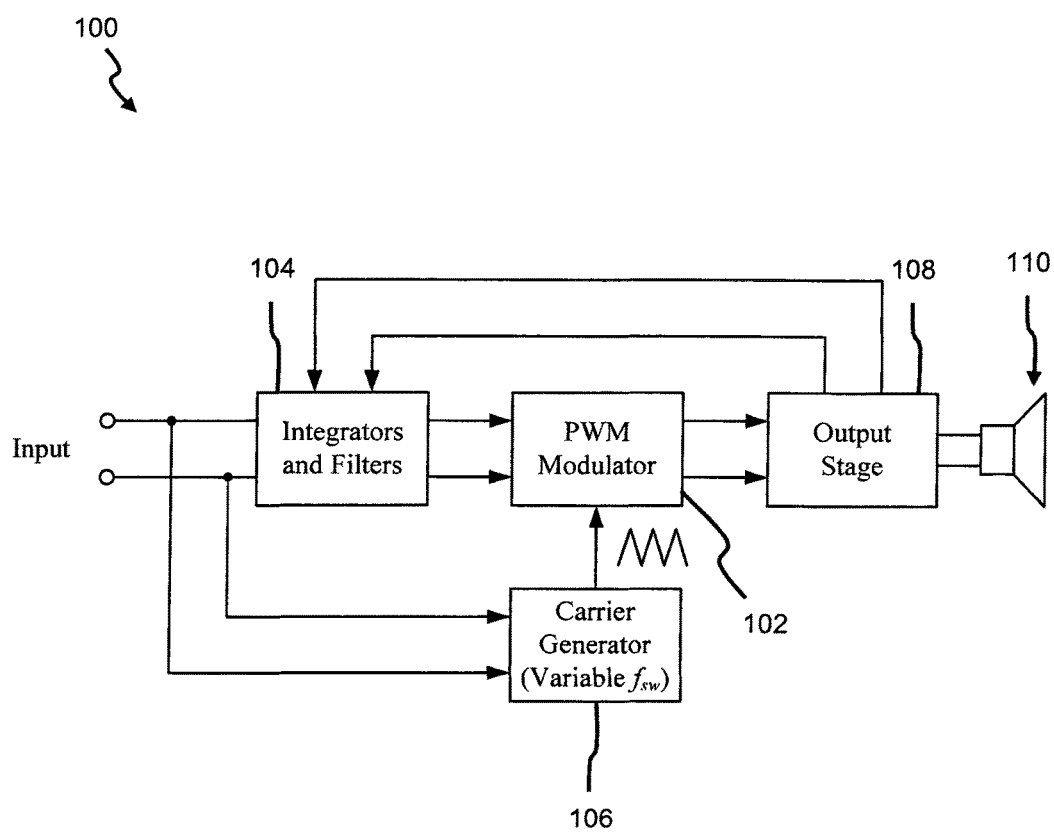
FIG. 1 is a block diagram of a Class D amplifier (CDA) which incorporates a pulse width modulator for generating a pulse width modulation (PWM) signal and a carrier generator, based on a first embodiment.
Figure 2A:
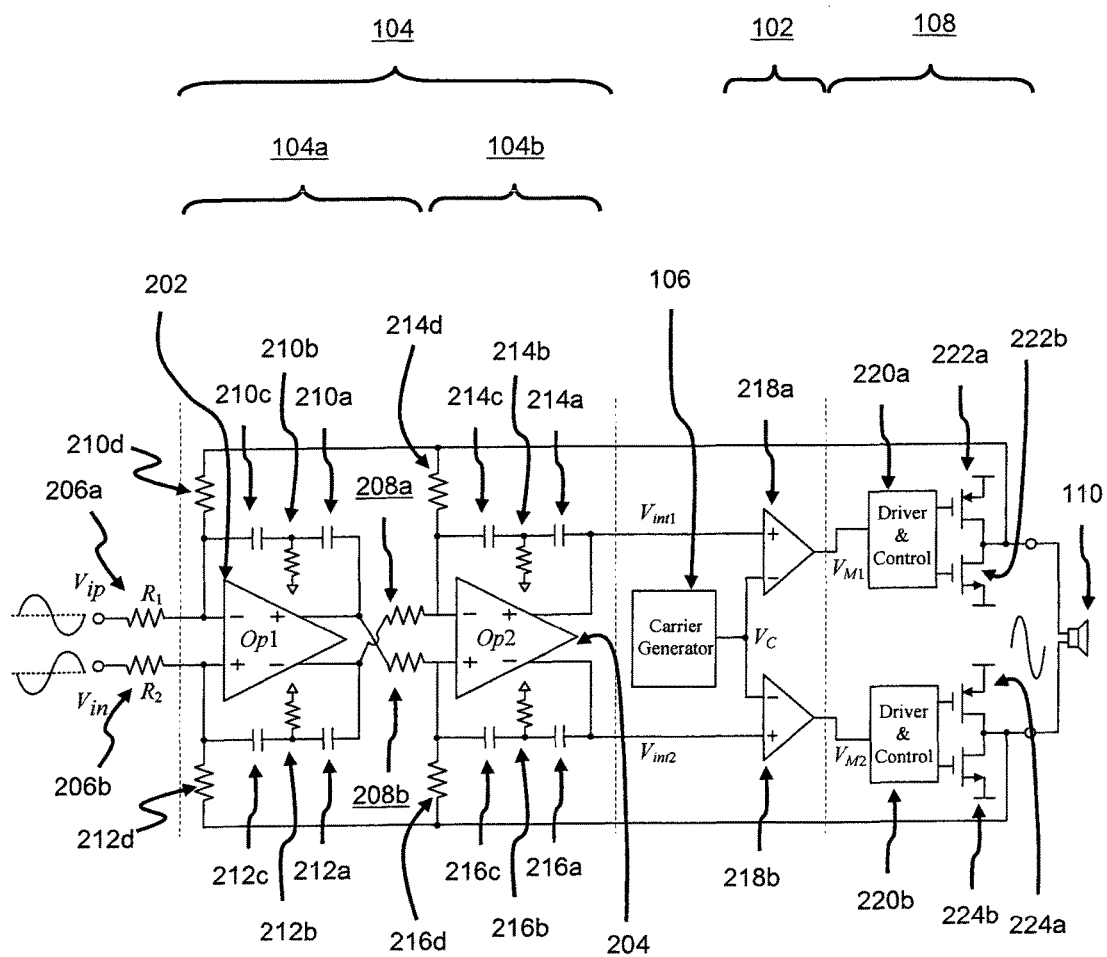
FIG. 2a is a schematic diagram of integrators and filters, the pulse width modulator, the carrier generator and an output stage of the amplifier of FIG. 1.
Figure 2B:
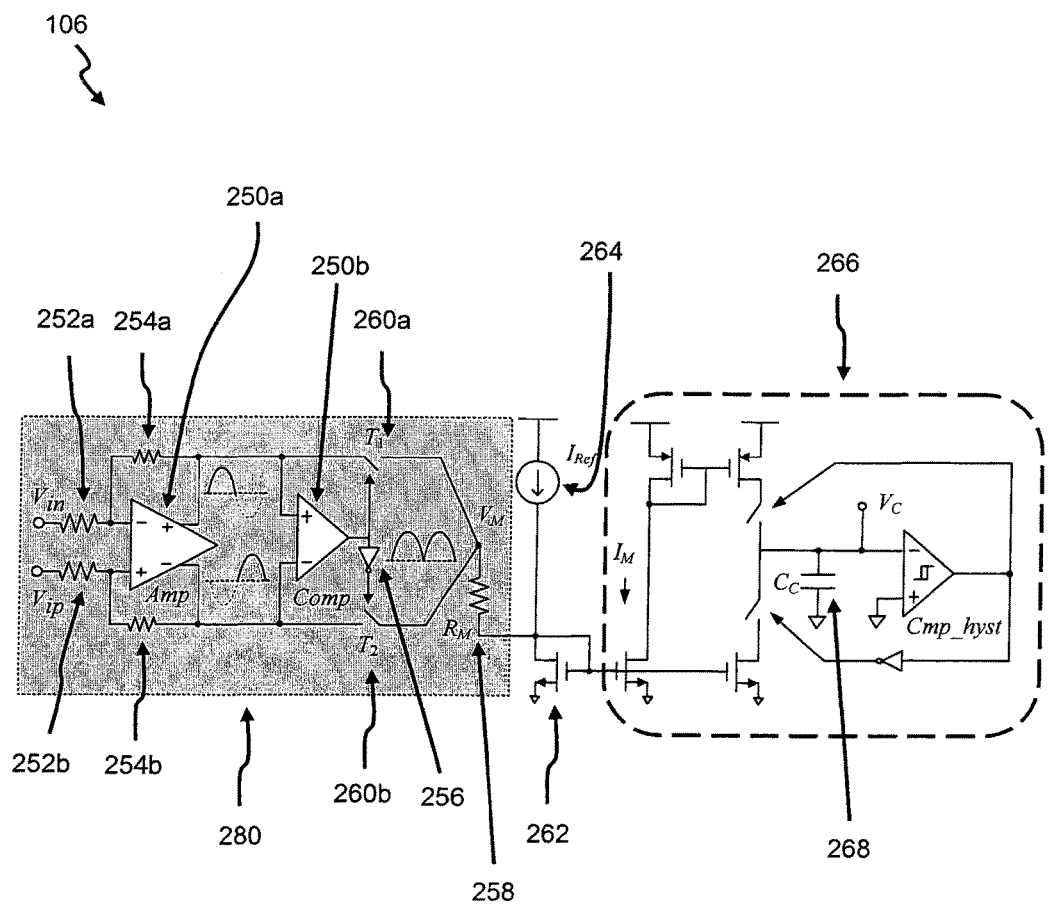
FIG. 2b is a schematic diagram of the carrier generator of the amplifier of FIG. 1.

FIG. 1 shows a block diagram of a Class D amplifier (CDA) 100 (hereafter first amplifier) which incorporates a pulse width modulator 102 for generating a pulse width modulation (PWM) signal, according to a first embodiment. The first amplifier 100 is an analog amplifier, which also includes an integrators-and-filters circuit 104, a carrier generator 106, and an output stage 108. Respective schematic diagrams of the pulse width modulator 102, integrators-and-filters circuit 104, carrier generator 106, and output stage 108 as per the arrangement in FIG. 1 are shown in FIGS. 2a and 2b. When the first amplifier 100 is being operated, it is to be appreciated that at least one amplifier input signal (with a magnitude) is to be provided to both the integrators-and-filters circuit 104, and the carrier generator 106. The integrators-and-filters circuit 104 are arranged to filtered and amplified the amplifier input signal and feedback signals from the output stage 108, as necessary, and then provide the filtered and amplified input signal to (modulator input(s) of) the pulse width modulator 102. Particularly, the integrators-and-filters circuit 104 adopts a double-feedback $2^{nd}$-integrator loop-filter design, comprising two integrator stages (to be explained below).

The amplifier input signal is also provided to the carrier generator 106 to generate a carrier (which has a triangular waveform), wherein the carrier's frequency, "$f_{sw}$", varies in dependence on the magnitude of the amplifier input signal. That is, the carrier's frequency increases when the magnitude of the amplifier input signal increases and vice-versa. It is also to be appreciated that varying the magnitude of a current varies the carrier's frequency, where the magnitude of the current is dependent on the magnitude of the amplifier input signal. This is in contrast to conventional PWM CDAs which typically operate with carriers having frequencies independent of magnitude of amplifier input signals. Specifically, when the magnitude of the amplifier input signal is high, the carrier's frequency $f_{sw}$ is also high correspondingly, and vice versa. The carrier is then provided to the pulse width modulator 102, which is configured to use the filtered and amplified input signal to modulate the carrier to generate the PWM signal to be provided to the output stage 108. In this instance, the output stage 108 is coupled to an acoustic generator 110 (which is not part of the first amplifier 100) to enable the PWM signal to be played as an audio signal to a user of the first amplifier 100. An example of the acoustic generator 110 is a high-fidelity speaker. Further, the output stage 108 is configured with a double feedback mechanism to provide feedback of the PWM signal to the integrators-and-filters circuit 104.

With reference to FIG. 2a, the integrators-and-filters circuit 104 schematically comprise first and second identically configured integrator stages 104a, 104b, which are both configured as $2^{nd}$ order integrators. In the first and second integrator stages 104a, 104b, there is provided a first fully differential amplifier 202 (i.e. Op1), and a second fully differential amplifier 204 (i.e. Op2) respectively. The negative and positive input terminals of the first fully differential amplifier 202 are respectively coupled to corresponding first and second resistors 206a, 206b (labelled as $R_1$ and $R_2$ in FIG. 2a). In the first integrator stage 104a, the negative and positive output terminals of the first fully differential amplifier 202 are in turn coupled, via respective third and fourth resistors 208a, 208b, to the negative and positive input terminals of the second fully differential amplifier 204. Further, the positive output terminal of the first fully differential amplifier 202 is connected in parallel to a first series of components being a first capacitor 210a, a fifth resistor 210b (which is electrically grounded), and a second capacitor 210c, all of which are coupled in parallel to a sixth resistor 210d and the negative input terminal of the first fully differential amplifier 202. Similarly, the negative output terminal of the first fully differential amplifier 202 is connected in parallel to a second series of components being a third capacitor 212a, a seventh resistor 212b (which is electrically grounded), and a fourth capacitor 212c, all of which are coupled in parallel to an eighth resistor 212d and the positive input terminal of the first fully differential amplifier 202.

In the second integrator stage 104b, the positive output terminal of the second fully differential amplifier 204 is connected in parallel to a third series of components being a fifth capacitor 214a, a ninth resistor 214b (which is electrically grounded), and a sixth capacitor 214c, all of which are coupled in parallel to a tenth resistor 214d and the negative input terminal of the second fully differential amplifier 204. The tenth resistor 214d and sixth resistor 210d are connected in parallel to a first terminal of the acoustic generator 110. Similarly, the negative output terminal of the second fully differential amplifier 204 is connected in parallel to a fourth series of components being a seventh capacitor 216a, an eleventh resistor 216b (which is electrically grounded), and an eighth capacitor 216c, all of which are coupled in parallel to a twelfth resistor 216d and the positive input terminal of the second fully differential amplifier 204. The twelfth resistor 216d and eighth resistor 212d are also connected in parallel to a second terminal of the acoustic generator 110.

Referring to the pulse width modulator 102 (which includes first and second comparators 218a, 218b), the carrier generator 106 provides the carrier (i.e. $V_C$) to the respective negative input terminals of the first and second comparators 218a, 218b (i.e. Cmp1 and Cmp2). The respective positive input terminals of the first and second comparators 218a, 218b are coupled to the positive and negative output terminals of the second fully differential amplifier 204. The output terminal of the first comparator 218a is coupled to a first driver-and-control module 220a of the output stage 108, while the output terminal of the second comparator 218b is coupled to a second driver-and-control module 220b of the output stage 108. The first driver-and-control module 220a has two output terminals coupled respectively to (the gate terminals of) a PMOS 222a and a NMOS 222b, which are in turn coupled together at the drain terminals for connection to the first terminal of the acoustic generator 110. Similarly, the second driver-and-control module 220b has two output terminals coupled respectively to (the gate terminals of) a PMOS 224a and a NMOS 224b, which are coupled together at the drain terminals for connection to the second terminal of the acoustic generator 110.

Referring to FIG. 2b, the carrier generator 106 comprises a fully differential amplifier 250a (i.e. Amp), and a comparator 250b (i.e. Comp) respectively. The negative and positive input terminals of the fully differential amplifier 250a are respectively coupled to corresponding first and second resistors 252a, 252b (of the carrier generator 106). Also, the positive output terminal of the fully differential amplifier 250a are coupled in parallel to the positive input terminal of the comparator 250b, and the negative input terminal of the fully differential amplifier 250a (via a third resistor 254a). The negative output terminal of the fully differential amplifier 250a are coupled in parallel to the negative input terminal of the comparator 250b, and the positive input terminal of the fully differential amplifier 250a (via a fourth resistor 254b). The output terminal of the comparator 250b is coupled to a logical NOT gate 256 (which is electrically grounded). The negative input and positive output terminals of the fully differential amplifier 250a, together with the positive input terminal of the comparator 250b, are also collectively coupled to a fifth resistor 258 (i.e. $R_M$), via first switch 260a (i.e. $T_1$). The positive input and negative output terminals of the fully differential amplifier 250a, together with the negative input terminal of the comparator 250b, are collectively coupled to the fifth resistor 258, via second switch 260b (i.e. $T_2$). In turn, the fifth resistor 258 is coupled to the drain terminal of a first NMOS 262 and a current source 264 (i.e. $I_{Ref}$). The source terminal of the first NMOS 262 is electrically grounded, whereas the gate terminal of the first NMOS 262 is also coupled to the fifth resistor 258 and current source 264, as well as to a conventional carrier generator 266. The conventional carrier generator 266 enables generation of a varying current (i.e. $I_M$), which is associated to the magnitude of the amplifier input signal.

It is also to be appreciated that the negative input terminal of the fully differential amplifier 250a (of the carrier generator 106) is coupled to the positive input terminal of the first fully differential amplifier 202 (of the integrators-and-filters circuit 104) to commonly receive a first amplifier input signal $V_{in}$. Similarly, the positive input terminal of the fully differential amplifier 250a (of the carrier generator 106) is coupled to the negative input terminal of the first fully differential amplifier 202 (of the integrators-and-filters circuit 104) to commonly receive a second amplifier input signal $V_{ip}$.

Compared to conventional solutions, which employ a constant current to charge and discharge a capacitor 268 ($C_C$) configured within the conventional carrier generator 266 in order to generate the carrier, the carrier generator 106 (of this embodiment) is instead arranged to generate the varying current, $I_M$. By way of illustration (using FIGS. 2a and 2b), the first and second amplifier input signals $V_{in}$ and $V_{ip}$ are provided to the first amplifier 100, where $V_{in}$ and $V_{ip}$ are input respectively into the negative and positive input terminals of the fully differential amplifier 250a (of the carrier generator 106). At the same time, $V_{in}$ and $V_{ip}$ are also input respectively into the integrators-and-filters circuit 104 to be processed and thereafter provided to the pulse width modulator 102. Referring now to the carrier generator 106 (in FIG. 2b), the inputted first and second amplifier signals $V_{in}$ and $V_{ip}$ are buffered by the fully differential amplifier 250a, whose outputs are subsequently provided to the comparator 250b to be compared. It is to be appreciated that when $V_{ip} > V_{in}$ (i.e. $V_{ip}$ is positive with respect to an input common-mode voltage (being computed as $(V_{in}+V_{ip})/2$), and $V_{in}$ is negative), the first switch 260a $T_1$ is operably closed and thus the inverted $V_{in}$ is electrically connected to $V_M$ which is the voltage at the fifth resistor 258 of the carrier generator 106. Conversely, when $V_{in} > V_{ip}$ (i.e. is positive with respect to the input common-mode voltage, and $V_{ip}$ is negative), the second switch 260b $T_2$ is then operably closed instead, and so now the inverted $V_{ip}$ becomes electrically connected to $V_M$. Hence, $V_M$ is always arranged to have a positive magnitude (with respect to the common-mode voltage), corresponding to the positive magnitude of the amplifier input signals. The fifth resistor 258 consequently converts $V_M$ into the current Hence, the current $I_M$ varies based on amplifier input signals provided to the first amplifier 100. The current $I_M$ is then used by the conventional carrier generator 266 to generate the carrier $V_C$ to be consequently provided to the pulse width modulator 102.

The carrier's frequency $f_{sw}$ is expressed as below:

$$f_{SW} = \frac{I_{ref} + \frac{|V_{in}|}{R_M}}{2V_C C_C} \quad (1)$$

For designing and realizing a prototype design of the first amplifier 100, a range for carrier's frequency $f_{sw}$ was used: 250 kHz (i.e. when the magnitude of the amplifier input signals is zero)<$f_{sw}$<420 kHz (i.e. when the magnitude of the amplifier input signals is at a maximum), and more specifically, a nominal value of the carrier's frequency $f_{sw}$ is taken to be about 300 kHz. The definition of nominal in this instance means about 15 dB below the maximum magnitude of the amplifier input signals.

Figure 3:
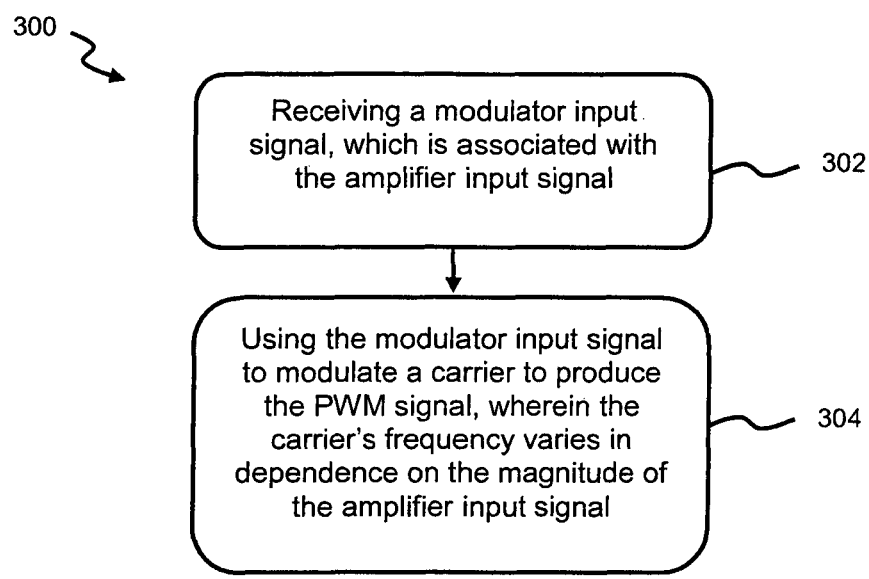
FIG. 3 is a flow diagram of an exemplary method, according to the first embodiment.

Accordingly, a related method 300 of generating a pulse width modulation (PWM) signal for the first amplifier 100 is shown in FIG. 3, wherein the first amplifier is arranged to receive an amplifier input signal having a magnitude. The method 300 comprises receiving a modulator input signal (from the integrators-and-filters circuit 104) at step 302, which is associated with the amplifier input signal; and using the modulator input signal (by the pulse width modulator 102) to modulate the carrier (from the carrier generator 106) to produce the PWM signal at step 304, wherein the carrier's frequency varies in dependence on the magnitude of the amplifier input signal.

In the context of CDAs, it is to be appreciated that hardware and power overheads of the proposed carrier generator 106 compared to conventional designs are negligible; additional hardware included in the carrier generator 106 is indicated by a box 280 (in dotted outline) in FIG. 2b. The reason is because operating specifications adopted for the fully differential amplifier 250a and comparator 250b are relaxed. Specifically, the fully differential amplifier 250a is configured with a gain-bandwidth of 100 kHz (with a resistive load of greater than 100 kΩ), whereas the comparator 250b is configured with a delay and a resolution of 10 μs, and 10 mV respectively. Moreover, it is to be appreciated that the hardware overheads of other components (i.e. the switches 260a, 260b, and resistors 252a, 252b, 254a, 254b, 258) are negligible too. From an implementation perspective, an IC area required for the additional hardware of the carrier generator 106, and power dissipation overheads incurred are respectively approximately less than 0.5% (i.e. less than about 100 μm by 100 μm) of the total IC area used for the first amplifier 100 and approximately less than 0.1% (i.e. less than 100 μW) of the total power dissipation of the first amplifier 100. In summary, performance overheads due to the additional hardware of the carrier generator 106 are largely negligible.

It is to be appreciated that the first amplifier 100 has been performance evaluated against conventional PWM CDAs (which use a fixed carrier frequency) on the basis of using a same carrier frequency $f_{sw}$ for fair performance benchmarking, and consequently determined to have the following advantages. Firstly, the first amplifier 100 has a lower THD+N at large magnitude of an amplifier input signal (as provided) without compromising the THD+N performance at small magnitude of the said amplifier input signal. This is largely because when the magnitude of the amplifier input signal is large, the THD+N performance is dominated by THD, and so THD decreases with increasing carrier frequency $f_{sw}$. On the other hand, when the magnitude of the amplifier input signal is small, the THD+N performance is instead dominated by signal noises, which are largely independent of the carrier frequency $f_{sw}$. Secondly, the first amplifier 100 has improved PSRR because when the magnitude of an amplifier input signal is large, a higher carrier frequency $f_{sw}$ allows for application of higher loop-gain (hence leading to improved PSRR) without compromising linearity/dynamic-range.

Thirdly, the first amplifier 100 also has improved overall power-efficiency because when a magnitude of an amplifier input signal is reduced, the carrier frequency $f_{sw}$ is similarly reduced, leading to a lower overall power dissipation for the first amplifier 100. Specifically, it is highlighted that because the crest factor of audio signals is typically about between 12 dB to 18 dB, and so to allow for signal headroom (to prevent signal clipping, based on nominal operating conditions), the magnitude of amplifier input signals is normally arranged to be low. Fourthly, the first amplifier 100 is able to achieve reduced EMI because a spectrum of the carrier frequency $f_{sw}$ components of a signal output (by the first amplifier 100) is now distributed over a wider frequency range. Consequently, a maximum magnitude of the carrier frequency $f_{sw}$ components is smaller than the equivalent of conventional PWM amplifiers. Finally, the power-efficiency of the first amplifier 100 is much improved because the carrier frequency $f_{sw}$ used is (on average) lower than for most conventional PWM CDAs. As aforementioned, because the magnitude of the amplifier input signal is typically low under nominal operating conditions, and so using a low carrier frequency $f_{sw}$ is therefore advantageous in this instance.

The remaining configurations will be described hereinafter. For the sake of brevity, description of like elements, functionalities and operations that are common between the different configurations are not repeated; reference will instead be made to similar parts of the relevant configuration(s).

2. Phase-Adjusted PWM—(I)

Based on literature [4], it has been determined that the THD in conventional PWM CDAs are caused by factors which include: (a) open-loop distortion (due to non-linearity of a carrier used and the dead-time in an output stage of an associated amplifier), (b) duty-cycle-error, and (c) phase-error. Factors (a) and (b) may be minimised by using a conventional negative feedback mechanism. Specifically, open-loop distortion and duty-cycle-error are largely inversely proportional to loop-gain, where a higher loop-gain beneficially results in a lower THD. However, the THD due to phase-error is conversely and adversely affected by a high loop-gain, where a higher loop-gain undesirably results in higher THD (due to factor (c)). Also, distortions due to duty-cycle-error and phase-error are introduced by the feedback; the intermodulation between residual switching components at the PWM input (or integrator output) and the carrier results in intrinsic system distortions. In short, there are no conventional solutions which are able to simultaneously reduce THD due to factors (a) to (c).

Figure 4A:
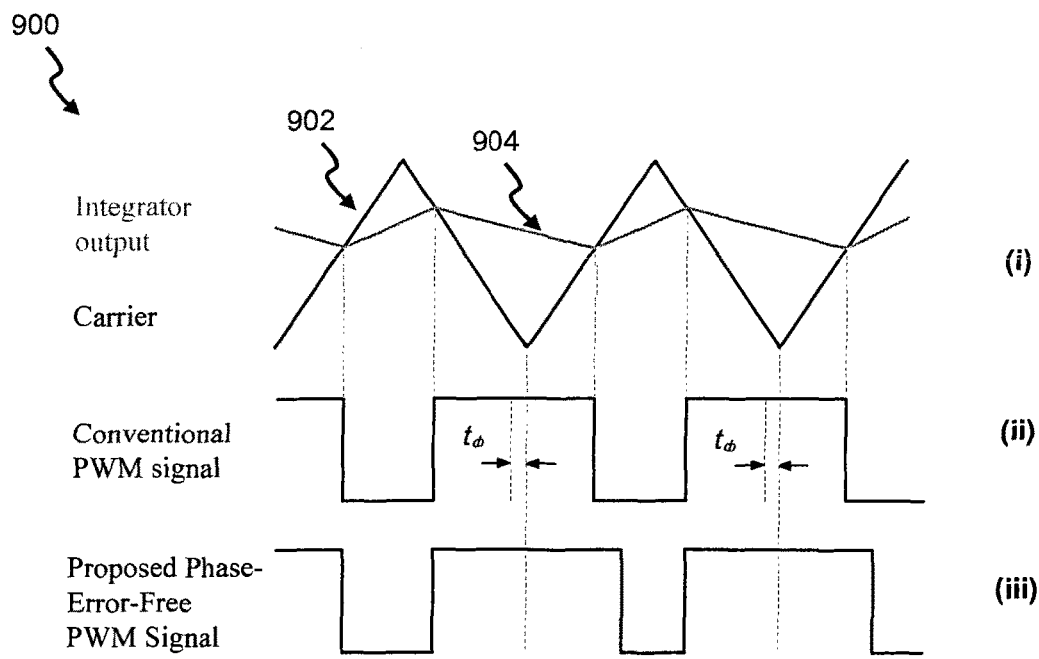
FIGS. 4a and 4b show respective sets of signal waveforms generated by conventional amplifiers and a CDA of FIG. 5a, based on a second embodiment.
Figure 4B:
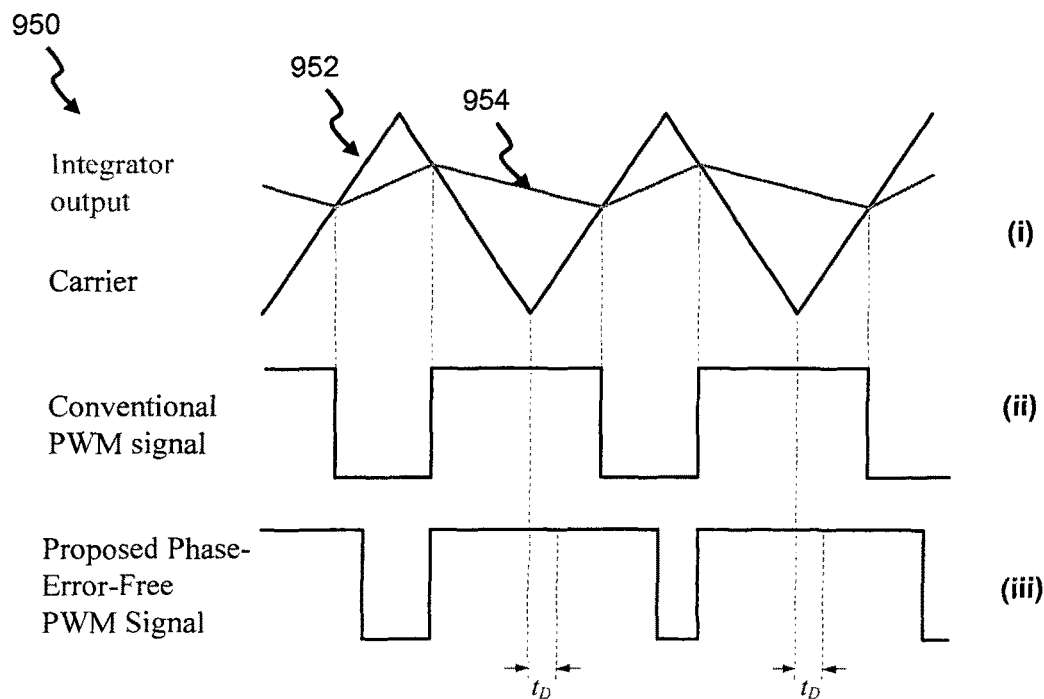

Moreover, the THD due to phase-error is inherent in conventional PWM CDAs, because there is a time delay (i.e. $t_\phi$) between the centre of a PWM signal with respect to the carrier, and the time delay is related to an amplifier input signal. To illustrate, FIGS. 4a and 4b show respective sets 900, 950 of signal waveforms generated by a conventional PWM-based CDA, as well as a CDA 1000 (hereafter second amplifier) shown in FIG. 5a, which is based on a second embodiment (to be elaborated below). Specifically, FIGS. 4a(i) and 4b(i) each shows the carrier waveform 902, 952 and integrators and filters output 904, 954, FIGS. 4a(ii) and 4b(ii) each shows a conventional PWM signal, and FIGS. 4a(iii) and 4b(iii) each shows a phase-adjusted PWM signal (generated by the second amplifier 1000). It is to be noted that for illustration purposes, the time delay in FIGS. 4a and 4b is shown slightly exaggerated.

Figure 5A:
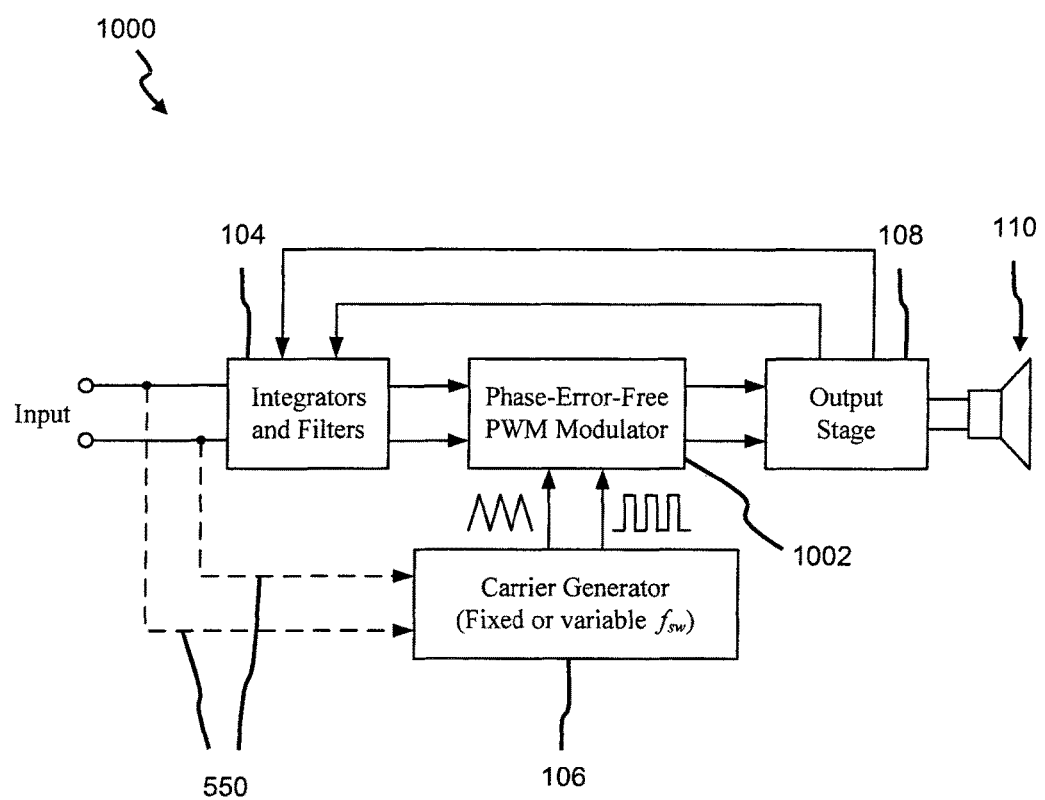
FIGS. 5a to 5c are block diagrams of the CDA which incorporates a phase-adjusting pulse width modulator (PWM) for generating a phase-adjusted PWM signal, based on the second embodiment.
Figure 5B:
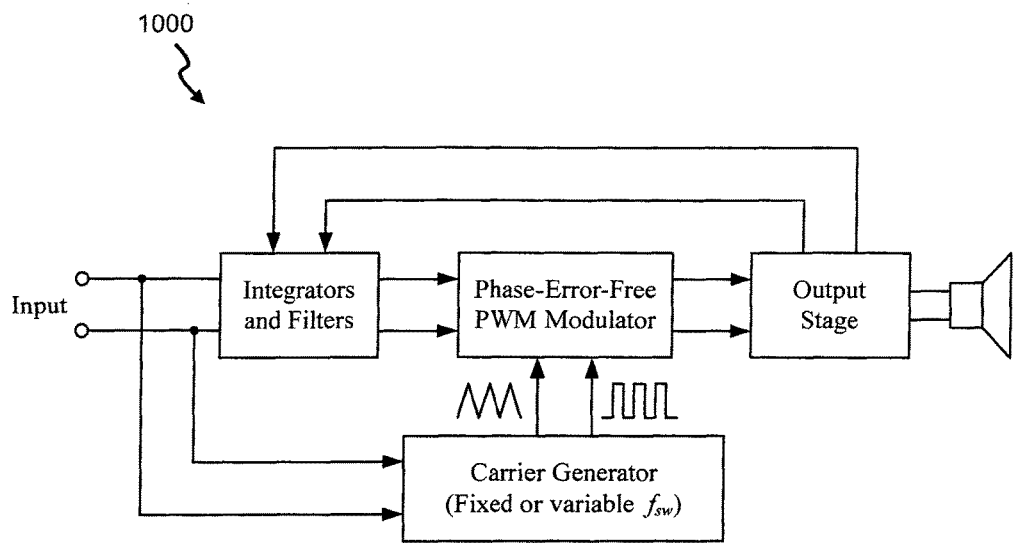
Figure 5C:
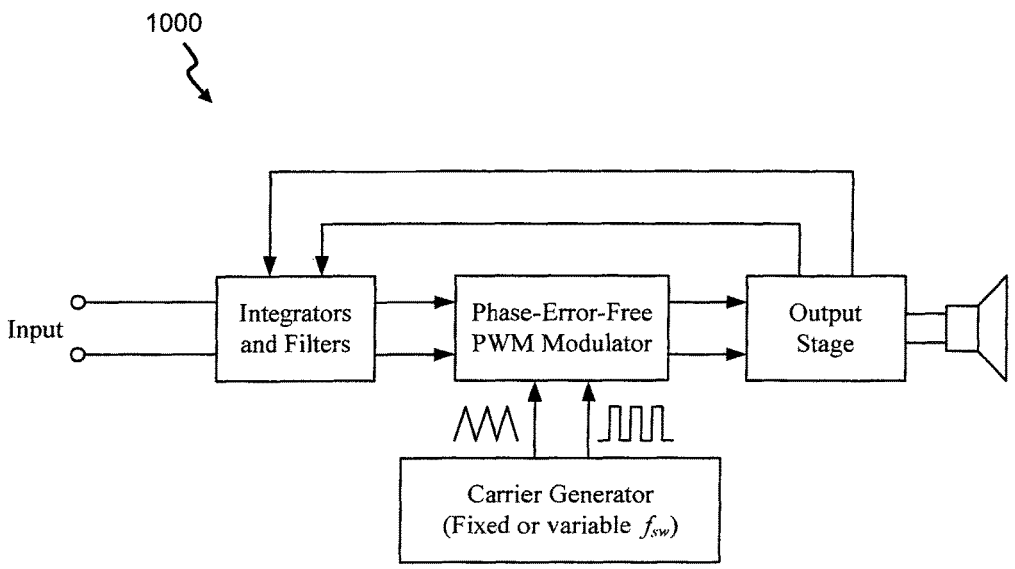

Hence, to simultaneously address the factors (a) to (c) to reduce THD, the second amplifier 1000 (of the second embodiment) shown in FIG. 5a is proposed, which is different to the first amplifier 100 only in that the pulse width modulator 102 in the first amplifier 100 is replaced by a phase-adjusting PWM 1002 for generating a phase-adjusted PWM signal. It is to be appreciated that the phase-adjusting PWM 1002 may alternatively be termed a phase-error-free PWM. The second amplifier 1000 is also an analog amplifier. Particularly, the second amplifier 1000 is beneficially configured to reduce the THD due to phase-error, while the THD due to open-loop distortion and duty-cycle-error are reduced by using a high loop-gain. As a result, the overall THD of the second amplifier 1000 is significantly improved. In this embodiment, the carrier's frequency $f_{sw}$ may be arranged to be fixed/variable, depending on requirements of an intended application. Specifically, the phase-adjusting PWM 1002 is largely based on the PWM 102 of FIG. 1, but includes additional circuitries to generate a phase-adjusted PWM signal. In other words, the second amplifier 1000 is an enhancement of the first amplifier 100. It is also to be appreciated that for this embodiment, the amplifier input signals may or may not be provided to the carrier generator 106 depending on applications/requirements. So this possibility is illustrated by using dashed-lines 550 (as shown in FIG. 5a) to indicate the optional provisioning of the amplifier input signals to the carrier generator 106. Specifically, FIG. 5b shows the case where the amplifier input signals are provided to the carrier generator 106, where the second amplifier 1000 is arranged to generate both a Signal Modulated PWM signal and a phase-adjusted PWM signal. On the other hand, FIG. 5c depicts that the amplifier input signals are not being provided to the carrier generator 106, where in this instance, the second amplifier 1000 is arranged to generate only a phase-adjusted PWM signal. Three variations for implementing the phase-adjusting PWM 1002 are envisaged, and each described in detail below.

Figure 6:
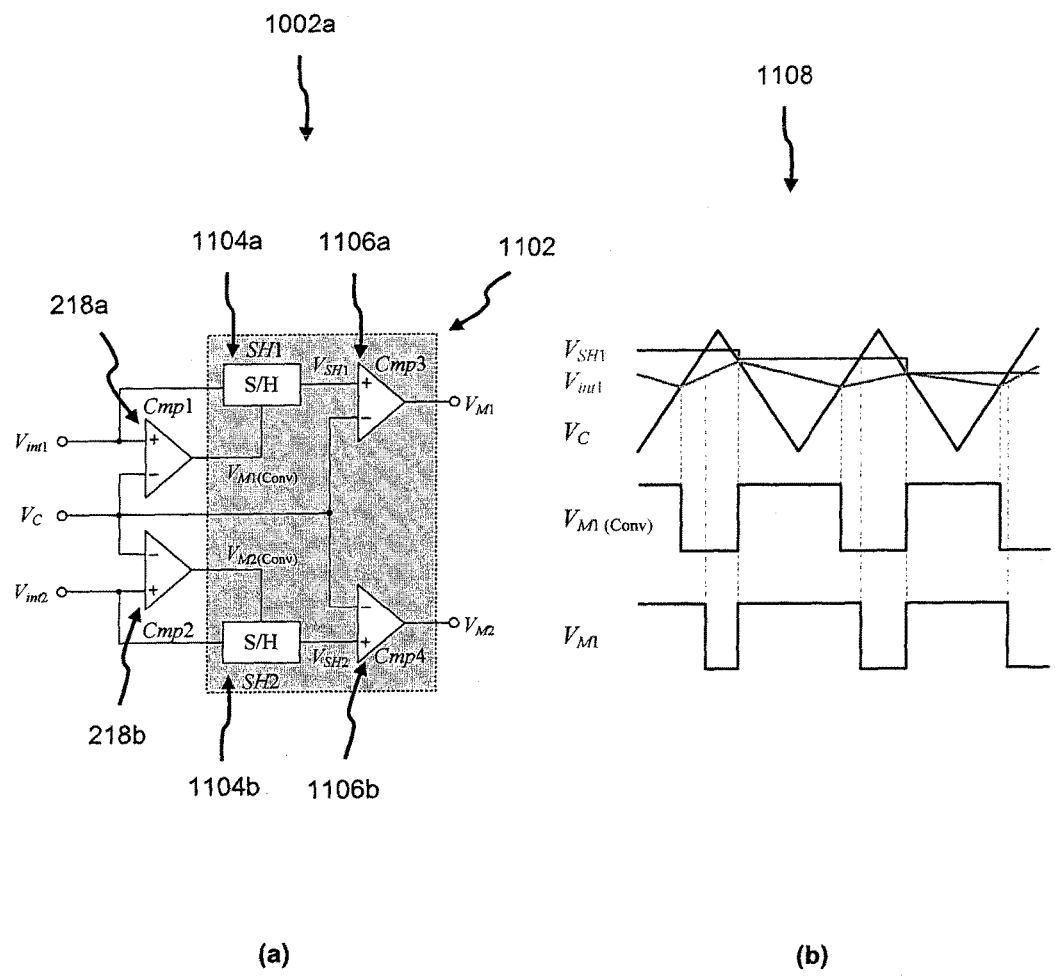
FIG. 6 includes FIGS. 6a and 6b, which are respectively a schematic diagram of a first implementation variation of the phase-adjusting PWM of FIG. 5a and a set of example signal waveforms generated thereby.

In a first implementation variation, FIG. 6a shows a schematic diagram of the phase-adjusting PWM 1002a, in which the reference numeral 1002a (instead of 1002) is herein used to refer to the first implementation variation. The phase-adjusting PWM 1002a includes a sample-and-hold circuit arrangement 1102 electrically connected to the first and second comparators 218a, 218b (i.e. Cmp1 and Cmp2). The sample-and-hold circuit arrangement 1102 includes first and second sample-and-hold (S/H) modules 1104a, 1104b (i.e. S/H1 and S/H2), plus third and fourth comparators 1106a, 1106b (i.e. Cmp3 and Cmp4). The first S/H module 1104a has an input terminal coupled to the positive input terminal of the second fully differential amplifier 204 (i.e. refer to FIG. 2a), and has another input terminal which receives a clock signal from the first comparator 218a. The first S/H module 1104a outputs a signal to the positive terminal of the third comparator 1106a. Similarly, the second S/H module 1104b has an input terminal coupled to the negative input terminal of the second fully differential amplifier 204 (i.e. refer to FIG. 2a), and has another input terminal to receive a clock signal from the second comparator 218b. The second S/H module 1104b outputs a signal to the positive terminal of the fourth comparator 1106b. The negative terminals of both the third and fourth comparators 1106a, 1106b are coupled to receive the carrier from the carrier generator 106. The output terminals of the third and fourth comparators 1106a, 1106b are respectively coupled to the first and second driver and control modules 220a, 220b of the output stage 108 (see FIG. 2a).

Flow of signals through the phase-adjusting PWM 1002a is as follows: the first and second comparators 218a, 218b receive signals $V_{int1}$ and $V_{int2}$ respectively from (the second fully differential amplifier 204 of) the integrators-and-filters circuit 104, and then compare $V_{int1}$ and $V_{int2}$ against the carrier $V_C$ (received from the carrier generator 106) to generate conventional PWM pulses $V_{M1(Conv)}$ and $V_{M2(Conv)}$ respectively. $V_{M1(Conv)}$ and $V_{M2(Conv)}$ are then provided as respective clock signals to the first and second S/H modules 1104a, 1104b. At a rising/falling edge of $V_{M1(Conv)}$ and $V_{M2(Conv)}$, the first and second S/H modules 1104a, 1104b are respectively triggered to take a sample value of $V_{int1}$ and $V_{int2}$ and hold the sampled values until a next rising/falling edge of $V_{M1(Conv)}$ and $V_{M2(Conv)}$. It is to be appreciated that the outputs of the first and second S/H modules 1104a, 1104b, $V_{sH1}$ and $V_{sH2}$ respectively, are provided as corresponding inputs to the third and fourth comparators 1106a, 1106b. The first and second S/H modules 1104a, 1104b are configured to sample fresh values of $V_{int1}$ and $V_{int2}$ at every rising/falling edge (depending on when the signal is sampled), i.e. $V_{SH1}$ and $V_{SH2}$ are updated at every rising/falling edge, and consequently the values of $V_{int1}$ and $V_{int2}$ thus remain largely unchanged in between two rising/falling edges. Also, it is to be appreciated that $V_{SH1}$ and $V_{SH2}$ are respectively the values of $V_{int1}$ and $V_{int2}$ at the rising/falling edge. Thereafter, the third and fourth comparators 1106a, 1106b compare the outputs (i.e. $V_{SH1}$ and $V_{SH2}$) of the first and second S/H modules 1104a, 1104b against $V_C$ to generate respective phase-adjusted PWM signals $V_{M1}$ and $V_{M2}$. It is to be appreciated that the PWM signals $V_{M1}$ and $V_{M2}$ have zero phase error, i.e. phase-error-free. As an illustration, FIG. 6b shows a set 1108 of example signal waveforms corresponding to the above described. Particularly, each phase-adjusted PWM signal $V_{M1}$ and $V_{M2}$ includes a series of phase-adjusted pulses with each phase-adjusted pulse defined by a pair of changing edges and a pulse centre, in which the pulse centre of each phase-adjusted pulse is fixed relative to a respective centre of the carrier, and one of the changing edges is synchronised to a triggering edge of the conventional PWM pulse $V_{M1(Conv)}$ and $V_{M2(Conv)}$.

Figure 7:
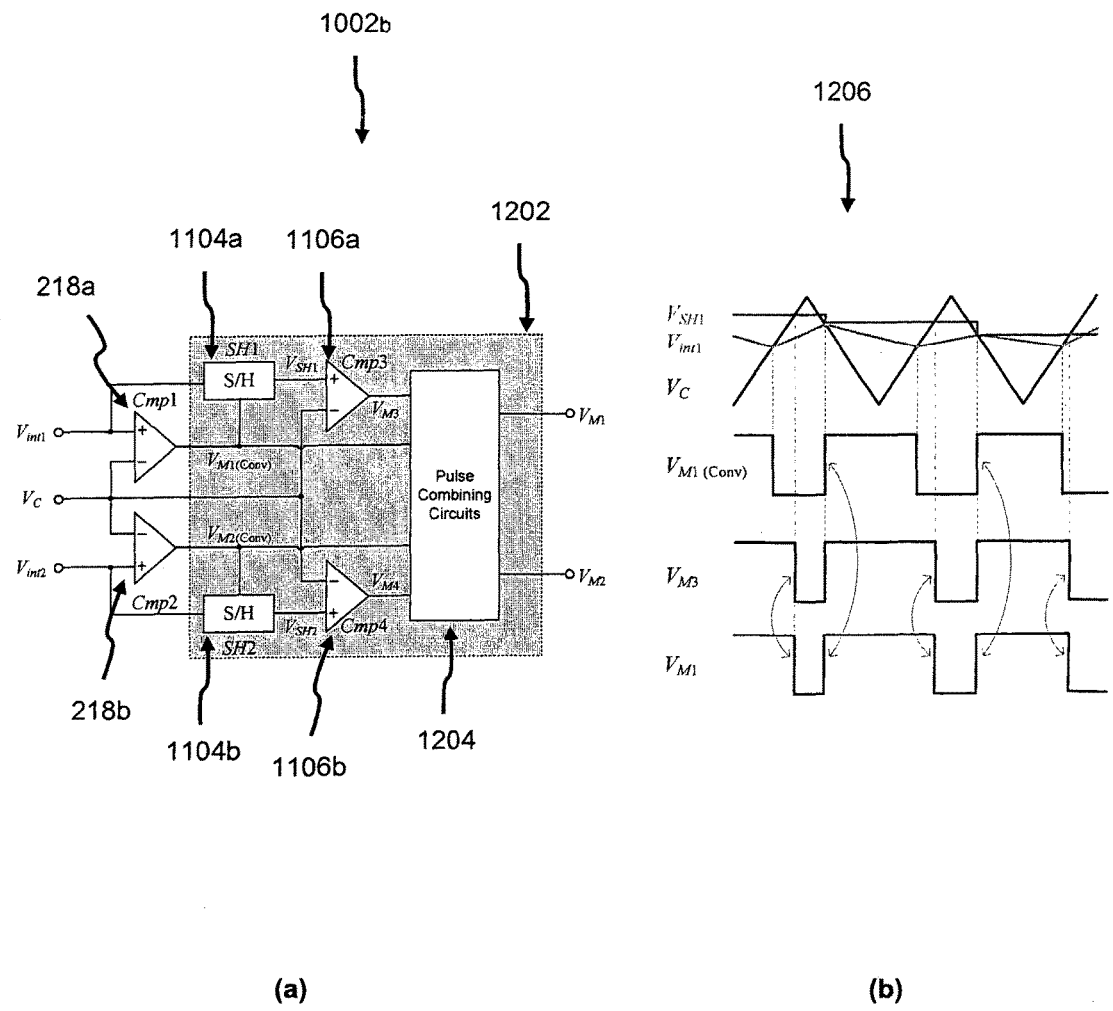
FIG. 7 includes FIGS. 7a and 7b, which are respectively a schematic diagram of a second implementation variation of the phase-adjusting PWM of FIG. 5a and a set of example signal waveforms generated thereby.

In a second implementation variation, FIG. 7a shows a schematic diagram of the phase-adjusting PWM 1002b, in which the reference numeral 1002b (instead of 1002) is now used to refer to the second implementation variation. The phase-adjusting PWM 1002b also includes a sample-and-hold circuit arrangement 1202, which is a simple modification of the sample-and-hold circuit arrangement 1102 of FIG. 6a, by further including a pulse combining circuit module 1204. It is to be appreciated that the pulse combining circuit module 1204 is implementable using conventional digital circuits. The pulse combining circuit module 1204 receives inputs from the (outputs of the) first, second, third and fourth comparators 218a, 218b, 1106a, 1106b to generate the phase-adjusted PWM signals $V_{M1}$ and $V_{M2}$.

It is to be appreciated that the flow of signals through the phase-adjusting PWM 1002b in FIG. 7a is largely similar as the phase-adjusting PWM 1002a in FIG. 6a, except that the phase-adjusted PWM signals $V_{M1}$ and $V_{M2}$ are now generated by combining the output signals (i.e. $V_{M3}$ and $V_{M4}$) of the third and fourth comparators 1106a, 1106b, in combination with the output signals from the first and second comparators 218a, 218b. Specifically, it is to be appreciated that a rising edge of $V_{M1}$ and $V_{M2}$ respectively coincides with a rising edge of $V_{M1(Conv)}$ and $V_{M2(Conv)}$, while a falling edge of $V_{M1}$ and $V_{M2}$ respectively coincides with a falling edge of $V_{M3}$ and $V_{M4}$. As an illustration, FIG. 7b shows a set 1206 of example signal waveforms corresponding to afore described. An advantage of the second implementation variation over the first implementation variation is the reduction in noise due to settling of error in the outputs of the first and second sample-and-hold (S/H) modules 1104a, 1104b.

Figure 8:
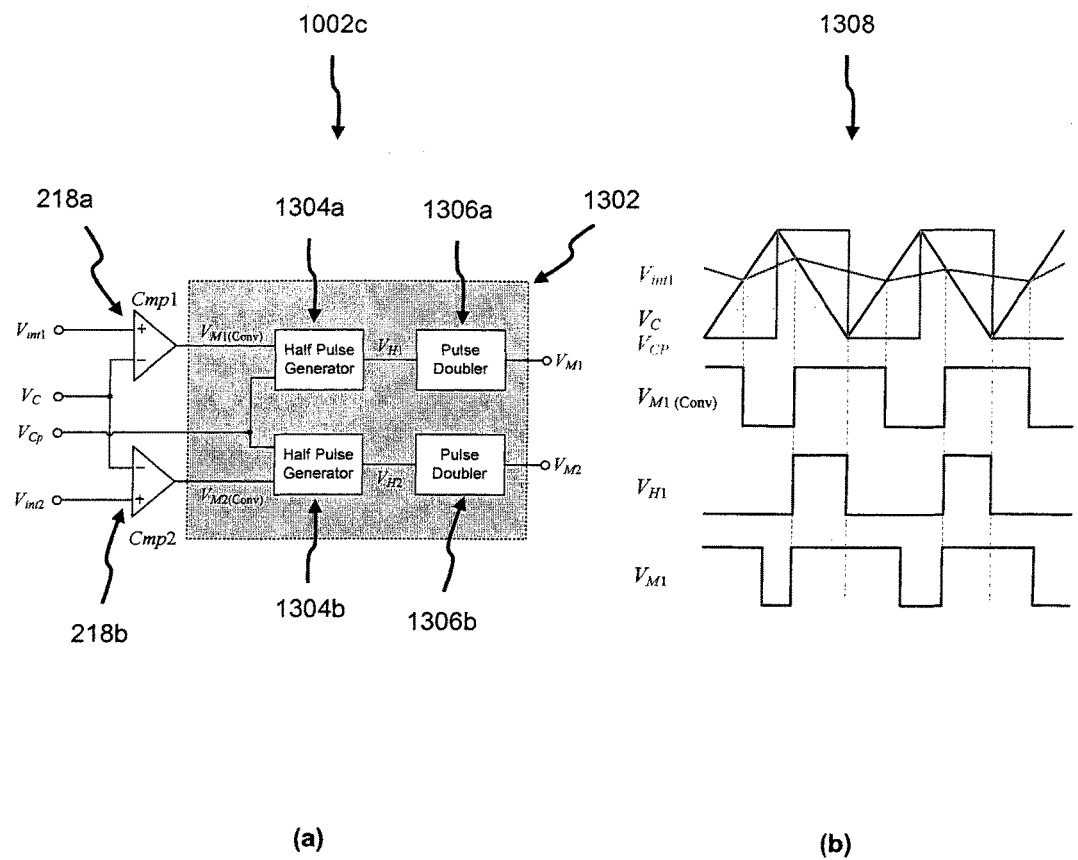
FIG. 8 includes FIGS. 8a and 8b, which are respectively a schematic diagram of a third implementation variation of the phase-adjusting PWM of FIG. 5a and a set of example signal waveforms generated thereby.

In a third implementation variation, FIG. 8a shows a schematic diagram of the phase-adjusting PWM 1002c, in which the reference numeral 1002c (instead of 1002) is used to refer to the third implementation variation. The phase-adjusting PWM 1002c comprises a half-pulse-doubling circuit arrangement 1302, which includes first and second half pulse generators 1304a, 1304b, plus first and second pulse doublers 1306a, 1306b. It is to be appreciated that the first and second half pulse generators 1304a, 1304b are implementable using conventional digital circuits. The first and second half pulse generators 1304a, 1304b respectively receive outputs of the first and second comparators 218a, 218b, and also a pulse signal $V_{cP}$ of the carrier $V_C$. The respective outputs of the first and second half pulse generators 1304a, 1304b are provided to the first and second pulse doublers 1306a, 1306b.

Specifically, the first and second comparators 218a, 218b compare the signals $V_{int1}$ and $V_{int2}$ against the carrier $V_C$, and generate the conventional PWM pulses $V_{M1(Conv)}$ and $V_{M2(Conv)}$, as already above explained. Using the $V_{M1(Conv)}$, $V_{M2(Conv)}$ and $V_{CP}$, the first and second half pulse generators 1304a, 1304b respectively generate "half-pulses" $V_{H1}$ and $V_{H2}$ which are arranged to have half a pulse width of a desired PWM signal (i.e. a phase-adjusted PWM pulse generated by the proposed phase-adjusting PWM 1002). Thereafter, the first and second pulse doublers 1306a, 1306b are arranged to double the pulse width of $V_{H1}$ and $V_{H2}$, and generate the phase-adjusted PWM pulses $V_{M1}$ and $V_{M2}$. As an illustration, FIG. 8b shows a set 1308 of example signal waveforms corresponding to the above described.

So broadly, in all three implementation variations 1002a-1002c, the phase-adjusting PWM 1002 is arranged to have a modulator input for receiving a modulated input signal, which is associated with an amplifier input signal received by the second amplifier 1000; a modulator (e.g. the first and second comparators 218a, 218b) for modulating the carrier with the modulated input signal to produce a PWM signal having a series of pulses, and a pulse circuit (e.g. the pulse combining circuit module 1204, or the first and second pulse doublers 1306a, 1306b) for adjusting the pulses of the PWM signal to produce a phase-adjusted PWM signal, wherein the phase-adjusted PWM signal includes a series of phase-adjusted pulses with each phase-adjusted pulse defined by a pair of changing edges and a pulse centre, the pulse centre of each phase-adjusted pulse being fixed relative to a respective centre of the carrier, and with one of the changing edges being synchronised to a triggering edge of the PWM signal.

Briefly referring to FIGS. 4a(iii) and 4b(iii) again, it can thus be observed that a PWM signal generated by the second amplifier 1000 has the following characteristics: (a) the centre of the PWM signal coincides with the centre of the carrier, or that a time delay (e.g. a fixed time delay) between the centre of the said PWM signal and the centre of the carrier does not introduce phase-error to an output signal of the second amplifier 1000; and (b) a rising/falling edge of the PWM signal coincides (i.e. synchronised) with a rising/falling (i.e. triggering) edge of a natural sampled PWM signal. It is to be clarified that a natural sampled PWM signal is generated by comparing an input signal directly with a PWM carrier signal. Alternatively, the PWM signal may also be generated by way of uniform sampling; the input signal is first sampled at a very high clock rate (i.e. typically 10 times higher than the input signal) and then compared against the carrier signal. Natural sampled PWM signals are more commonly used compared to uniform sampling and have a number of advantages, including having lower noise and distortion characteristics, may be generated using simpler hardware and etc.

To clarify, the definition of the pulse centre, of each phase-adjusted pulse being fixed relative to a respective centre of the carrier includes the pulse centre being in registration with the respective centre of the carrier, or a delay between the pulse centre and the centre of the carrier being constant and is independent of the magnitude of the input signal (as shown in FIG. 4b, where a phase-error of the phase-adjusting PWM 1002 is zero). It is to be appreciated that in most instances, the duty cycle is adjusted accordingly, but in certain occasions (or at some specific time points during operation of the second amplifier 1000) such as when a magnitude of the amplifier input signal is maintained for a period of time, a duty cycle of the pulses may remain unchanged (and in fact, for these occasions, no parameters of the pulses are adjusted). It is however to be noted that the above happens only occasionally during operation of the second amplifier 1000. As an intention of this embodiment is to ensure that the pulse centre is configured to be at a "correct position" (i.e. in registration with the respective centre of the carrier, or that the delay between the pulse centre and the centre of the carrier is constant), it is thus appreciated that the duty cycle may be adjusted accordingly, depending on situation and application.

Figure 9:
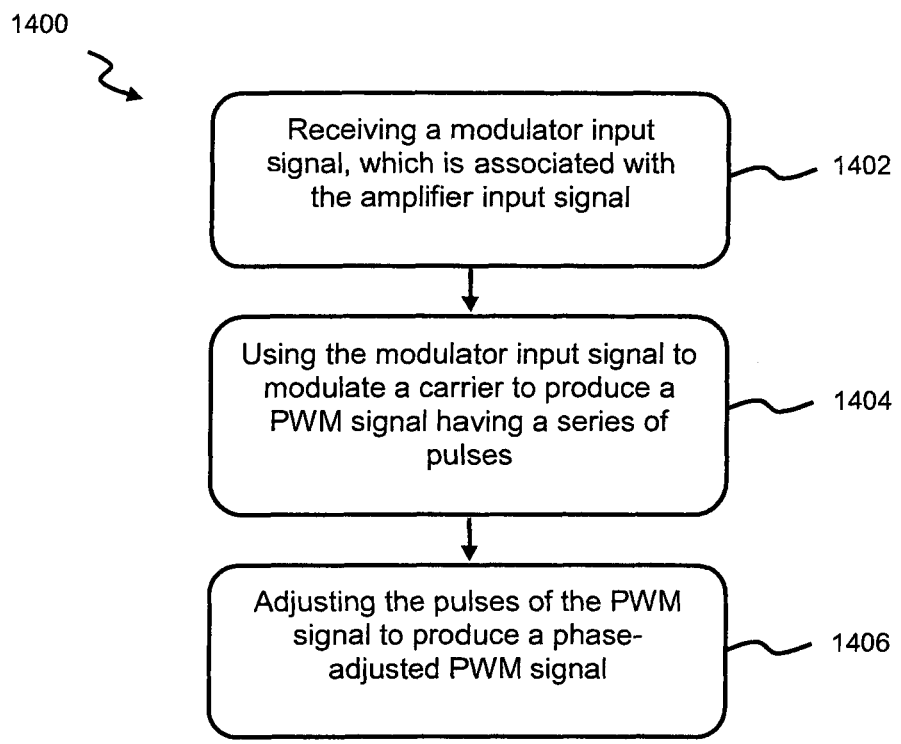
FIG. 9 is a flow diagram of an exemplary method, according to the second embodiment.

Accordingly, a related method 1400 of generating a phase-adjusted PWM signal for the second amplifier 1000 is shown in FIG. 9, the second amplifier 1000 being arranged to receive an amplifier input signal. The method 1400 comprises receiving a modulator input signal (from the integrators-and-filters circuit 104) at step 1402, which is associated with the amplifier input signal; using the modulator input signal to modulate a carrier to produce a PWM signal having a series of pulses at step 1404; and adjusting the pulses of the PWM signal to produce the phase-adjusted PWM signal at step 1406, the phase-adjusted PWM signal including a series of phase-adjusted pulses with each phase-adjusted pulse defined by a pair of changing edges and a pulse centre, the pulse centre of each phase-adjusted pulse being fixed relative to a respective centre of the carrier, and with one of the changing edges being synchronised to a triggering edge of the PWM signal.

It is to be appreciated that in comparison with conventional PWM, for all three implementation variations 1002a-1002c of the phase-adjusting PWM 1002, the added overheads in terms of hardware (i.e. IC area required for the additional circuitries) and power-dissipation for the additional circuitries are fairly negligible, accounting for less than 1% of the overall overheads of the second amplifier 1000. Moreover, compared to the conventional PWM, another advantage of the proposed phase-adjusting PWM 1002 lies in having significantly reduced phase-error (albeit at cost of a slight increase in duty-cycle-error, but it is highlighted that the slight increase in duty-cycle-error is largely inconsequential due to being significantly reducable by using a high loop-gain). As a result, the overall THD+N of the second amplifier 1000 are improved significantly, as well as having other advantages described below.

The said other advantages of the second amplifier 1000 over conventional PWM CDAs include having a lower THD+N at high input frequencies, because for conventional PWM CDAs, the THD+N at high input frequencies is dominated by the THD due to phase-error, whereas for the second amplifier 1000, any THD+N arising from phase-error is considered negligibly zero. Hence, the THD+N is significantly reduced at high input frequencies for the second amplifier 1000. Secondly, the second amplifier 1000 improves on the PSRR performance, because the THD arising from phase-error is negligible (hence significantly reducing THD+N at high input frequencies) which allows for use of a high loop-gain without compromising the THD+N at high input frequencies. That is, the high loop-gain consequently results in improved PSRR for the second amplifier 1000.

3. Phase-Adjusted PWM—(II)

3.1 System-Level Design

Figure 10:
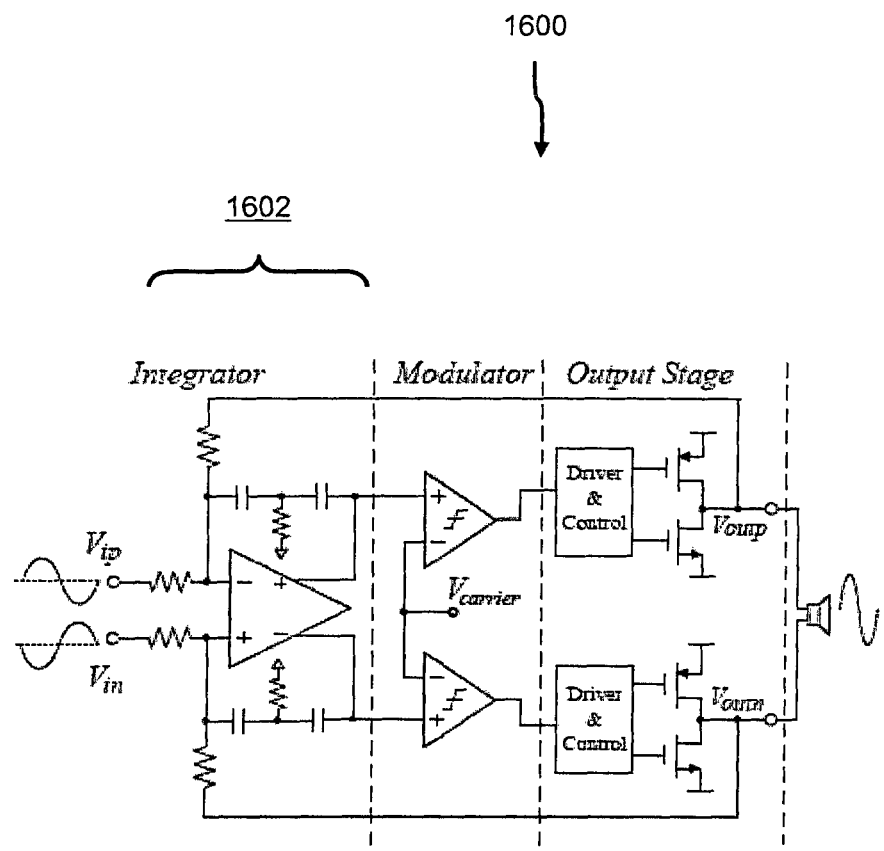
FIG. 10 is a schematic diagram of a single-feedback $2^{nd}$-order integrator PWM CDA, according to the prior art.

As explained, PWM is presently the most prevalent modulation scheme used for CDAs. Open-loop PWM CDAs were originally used due to their simplicity in hardware, but are now largely discarded due to their poor linearity and low PSRR characteristics [25]. However, closed-loop CDAs are now ubiquitous because of their improved performance largely due to use of negative feedbacks [4, 16, 17, 21]. FIG. 10 is a schematic diagram of a single-feedback $2^{nd}$-order integrator PWM CDA 1600, according to the prior art. The output signals (i.e. $V_{outp}$ and $V_{outm}$) of the $2^{nd}$-order integrator PWM CDA 1600 are fed (back) to an integrator stage 1602 thereof, which integrates the signals with input signals (i.e. $V_{ip}$ and $V_{in}$) provided to the $2^{nd}$-order integrator PWM CDA 1600, forming a closed-loop.

Based on the discussions in section 2 above, it will be understood by now that the loop-gain of the closed-loop is a fundamental design parameter, which directly and markedly affects two important specifications of CDAs, being the THD and PSRR [4, 16], in the following ways:

(1). A high loop-gain results in a large in-band gain (at audio frequencies), consequently leading to high PSRR (and reduced (i.e. improved) PS-IMD [11, 16]) as the large gain suppresses the (audio frequency) supply noise introduced at output stage(s) of CDAs.

(2). As opposed to linear amplifiers, a high loop-gain may conversely and inadvertently exacerbate [4, 21] the distortions in CDAs, because a high loop-gain inevitably results in reduced out-of-band attenuation (at high frequencies, particularly at the switching frequency) of the switching signal component. The residual switching signal component intermodulates with the carrier during the PWM modulation process, thereby introducing distortions [4, 21].

(3). Following from (2), the distortions arise from aforementioned duty-cycle error and phase-error. Particularly, the phase-error distortion arises because a time delay between the centre of the PWM signal and the centre of the carrier is signal-dependent, and the said distortion cannot be suppressed by the in-band loop-gain [4]. In other words, the phase-error distortion may undesirably increase as the loop-gain increases.

There is thus an inevitable trade-off between PSRR and linearity when designing the loop-gain: a large loop-gain improves the PSRR but potentially exacerbating distortions. Furthermore, a large loop-gain may limit the maximum non-saturated signal swing of CDAs, i.e. the maximum signal swing without any clipping effect at the output of the integrator stage. This is because a large loop-gain results in a large (less attenuated) switching signal component at the integrator output, which removes part of the headroom for the audio signal swing. The limited (unclipped) signal swing at the integrator output then limits the low-distortion maximum output signal swing of CDAs; the clipped integrator output signal leads to a drastic increase in distortions and may easily be observed from a sudden increase in THD+N in the high output power range. In theory, although a very high switching frequency may resolve the above issues, it is nevertheless not desirable.

Figure 11A:
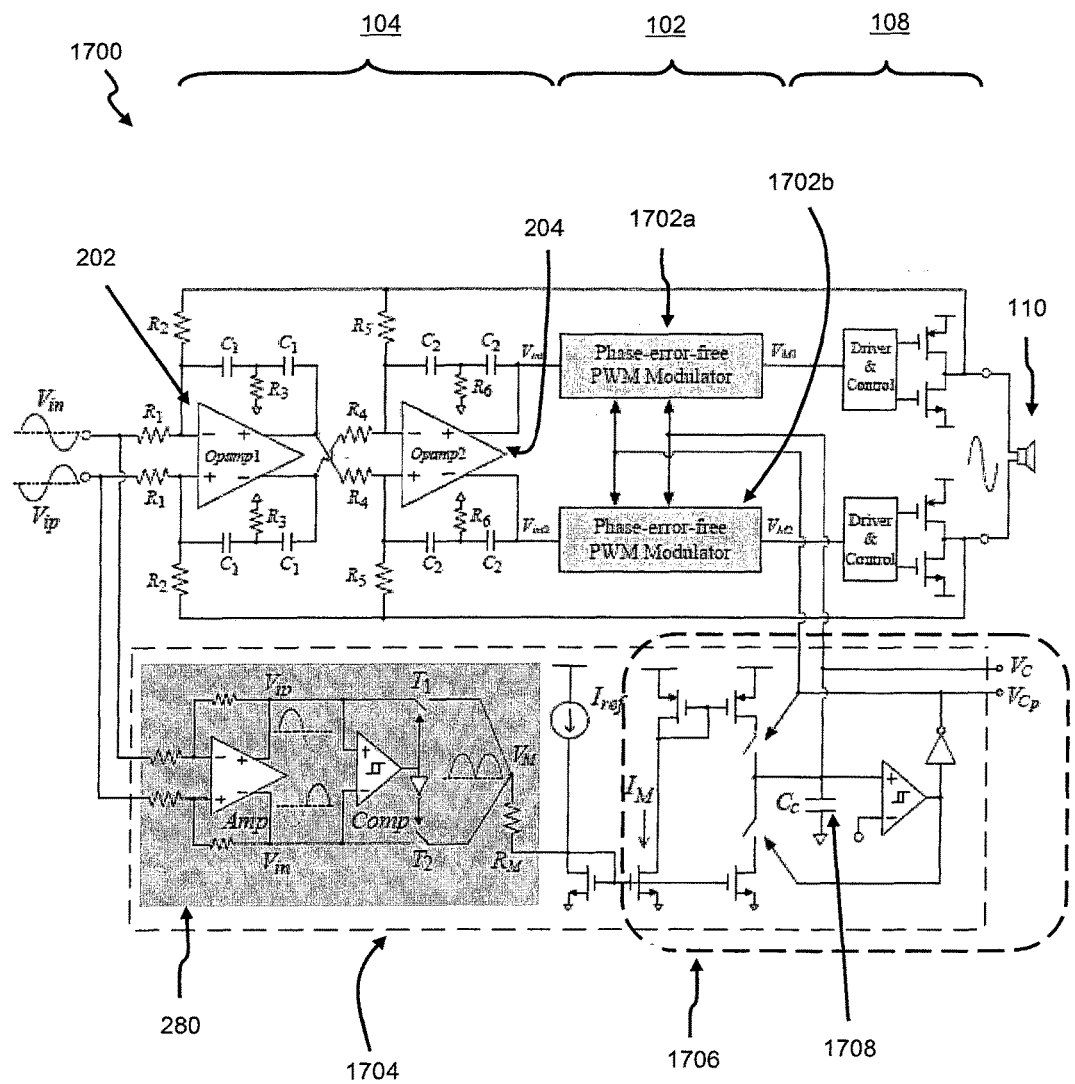
FIG. 11a is a schematic diagram of a CDA which (is arranged with double feedback and) incorporates two phase-adjusting PWMs and a Signal-Modulated PWM, based on the arrangement of FIG. 5b, according to a third embodiment.

So to address the undesirable trade-offs, FIG. 11a shows a schematic diagram of a proposed CDA 1700 (hereafter third amplifier) which (is arranged with double feedback and) incorporates first and second phase-adjusting pulse width modulators 1702a, 1702b (in respective differential branches), according to a third embodiment. So, the first and second phase-adjusting pulse width modulators 1702a, 1702b are in a parallel arrangement. It is to be appreciated that the third amplifier 1700 is an example circuit implementation of the second amplifier 1000, and specifically corresponding to the arrangement shown in FIG. 5b. Thus, the third amplifier 1700 is also an analog amplifier.

The third amplifier 1700 operates as follows: a carrier generator 1704 (of the third amplifier 1700) receives the amplifier input signals $V_{in}$ and $V_{ip}$ as the modulating signal to vary a frequency of the carrier. It is to be appreciated that the carrier generator 1704 is largely similar to the carrier generator 106 of FIG. 2b (and a circuit arrangement 1706 of the carrier generator 1704 is similar to the conventional carrier generator 266 of FIG. 2b). Specifically, when a magnitude of the amplifier input signal increases, a switching frequency of the carrier also increases accordingly; and vice versa. In this manner, the switching frequency at nominal operating conditions remains low, which reduces switching power dissipation and generates less ground-bounce noise. It is to be noted that the switching frequency increases to a maximum when a magnitude of the amplifier input signals is at a maximum. Modulation of the carrier's frequency by the input signal is largely desirable. Firstly, it desirably leads to increased attenuation of the switching component when the output power is large, as the switching is now at a higher frequency. Consequently, the potential signal-clipping is mitigated and distortions are reduced. Secondly, the increased attenuation consequently allows adoption of a high loop-gain filter design. Thirdly, the switching frequency is now distributed over a wider frequency range, and in turn potentially reduces the radiated EMI of the third amplifier 1700 [8]. More details about the proposed carrier generator 1704 are discussed below, where it will be shown that, compared to conventional carrier generators, the hardware requirements and quiescent power overheads of the proposed carrier generator 1704 are determined to be negligible.

It is to be highlighted that the proposed carrier generator 1704, together with the first and second phase-adjusting pulse width modulators 1702a, 1702b, individually and collectively enables a fairly large loop-gain to be employed, without compromising the dynamic range and/or the linearity of the third amplifier 1700.

Figure 11B:
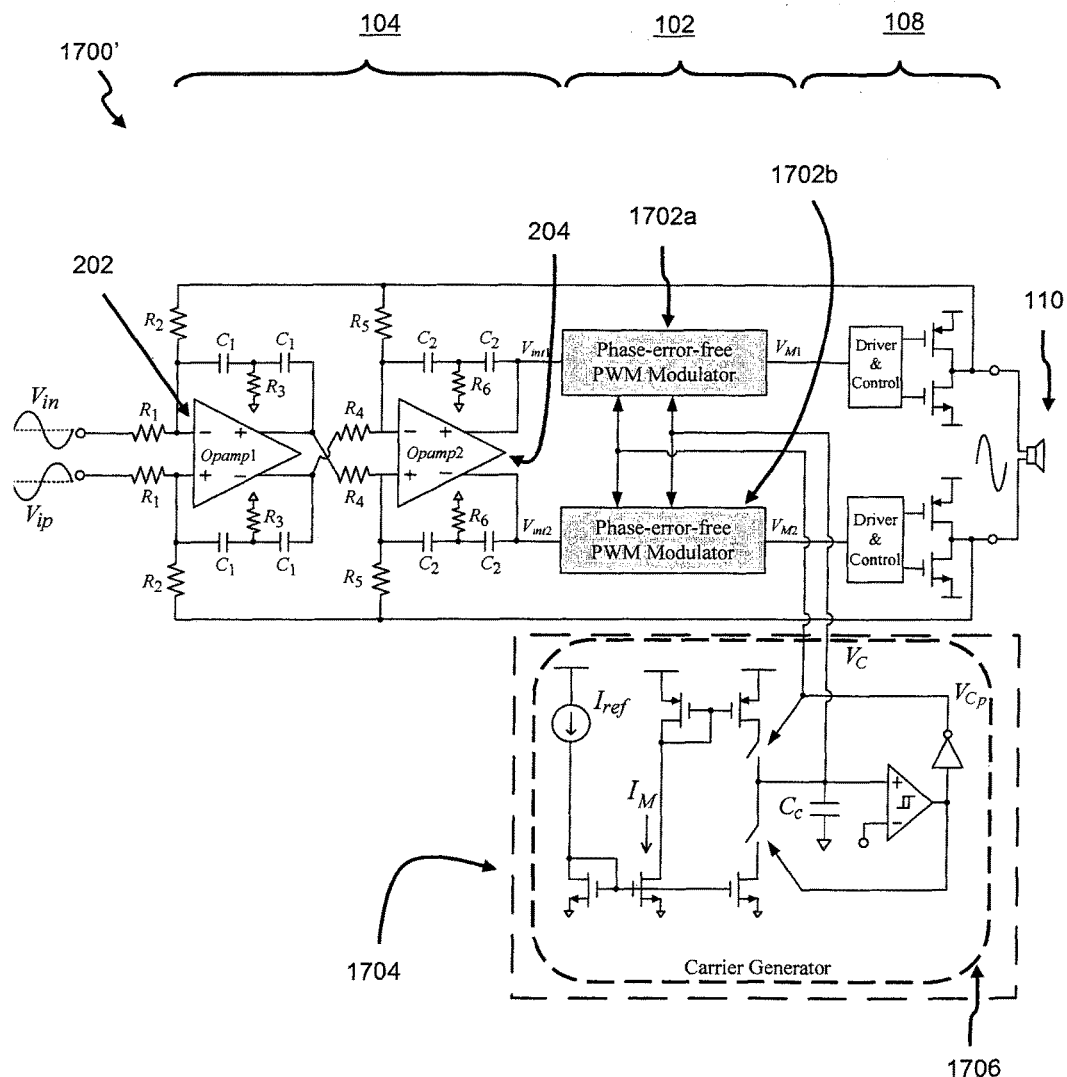
FIG. 11b shows a schematic diagram of another CDA which (is arranged with double feedback and) incorporates two phase-adjusting PWMs, based on the arrangement of FIG. 5c.

As a comparison to FIG. 11a, FIG. 11b shows another circuit implementation 1700' of the second amplifier 1000, corresponding instead to the arrangement depicted in FIG. 5c. It will be appreciated that the configuration in FIG. 11b is identical to that shown in FIG. 11a, except that the carrier generator 1704 in FIG. 11b now only comprises the circuit arrangement 1706, which is a conventional carrier generator, as already above explained.

3.2 Circuit-Level Design

The circuit designs adopted for selected components of the third amplifier 1700 are discussed in this section.

A. Proposed Phase-Error-Free PWM Modulator

Figure 12:
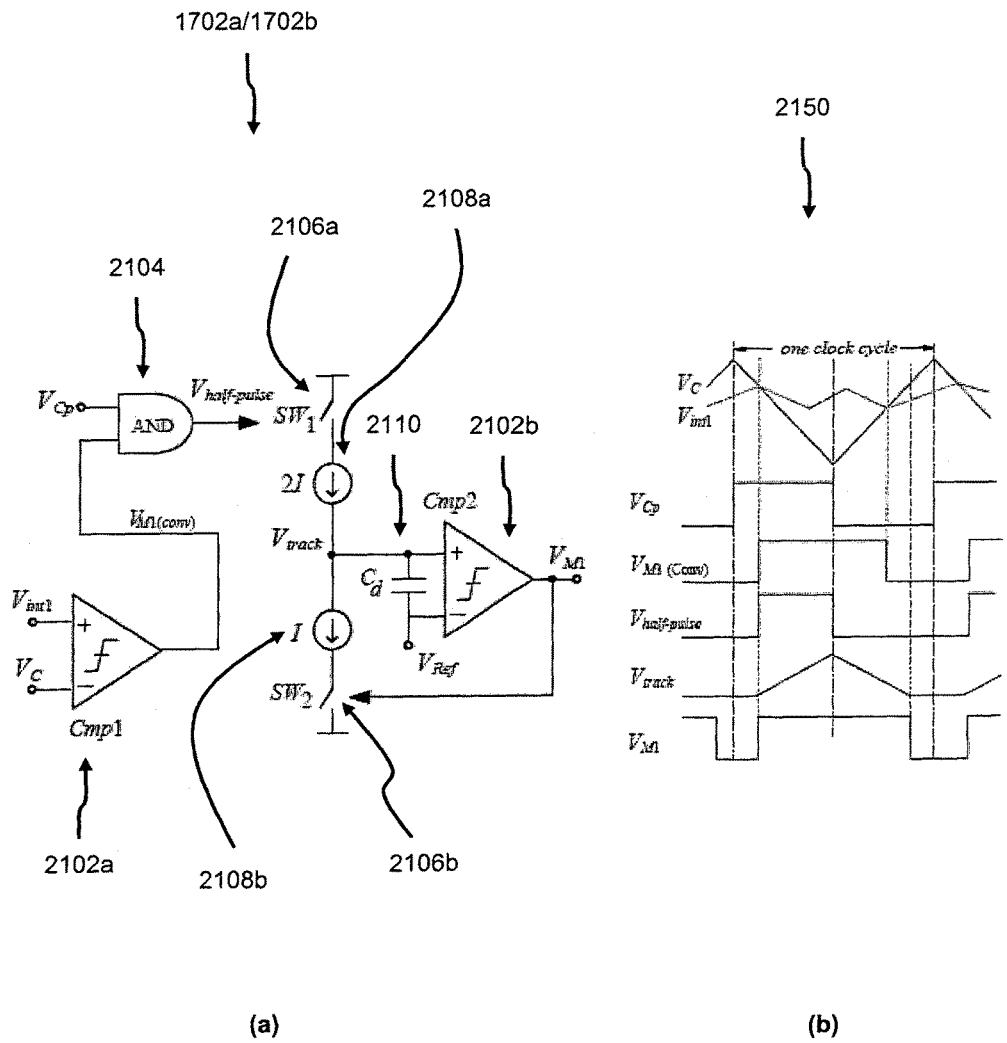
FIG. 12 includes FIGS. 12a and 12b, which are respectively a schematic diagram of the individual phase-adjusting PWM of FIG. 11a and a set of example signal waveforms generated thereby.

FIGS. 12a and 12b respectively depict a schematic diagram of the individual phase-adjusting PWM 1702a, 1702b of FIG. 11a (and also apply to FIG. 11b) and a set 2150 of example signal waveforms generated thereby. For completeness, it is noted again that each phase-adjusting PWM 1702a, 1702b is arranged at respective differential branches of the output stage 108 as depicted in FIG. 11a (and also apply to FIG. 11b). For brevity, only operations for the first phase-adjusting PWM 1702a are discussed below (which apply mutatis mutandis to the second phase-adjusting PWM 1702b).

The first phase-adjusting pulse width modulator 1702a includes first and second comparators 2102a, 2102b (i.e. Cmp1, Cmp2), a logical AND gate 2104, first and second switches 2106a, 2106b (i.e. SW$_1$, SW$_2$), a 2I current source 2108a, a I current source 2108b, and a capacitor 2110 (C$_d$). The capacitor 2110 is connected between the input terminals of the second comparator 2102b, while the 2I current source 2108a, and I current source 2108b are coupled (at respective first terminals) in parallel with the capacitor 2110 to the positive terminal of the second comparator 2102b. The output terminal of the AND gate 2104 is coupled to (the second terminal of) the 2I current source 2108a via the first switch 2106a. The output terminal of the second comparator 2102b is also coupled to (the second terminal of) the I current source 2108b via the second switch 2106b.

With reference to FIG. 12b, operation of the first phase-adjusting pulse width modulator 1702a is now described. The first comparator 2102a is arranged to compare an output signal V$_{int1}$ (from the integrators-and-filters circuit 104) with the carrier V$_C$ to generate a conventional PWM signal, V$_{M1(conv)}$. The AND gate 2104 is configured to generate a "half-pulse", V$_{half-pulse}$, by combining the pulse signal V$_{Cp}$ of the carrier V$_C$ with V$_{M1(conv)}$. The "half-pulse" is essentially one half of a complete PWM pulse that is provided to the output stage 108, and is phase-error-free. Subsequently, V$_{half-pulse}$ switches on the 2I current source 2108a and the capacitor 2110 commences to charge from its original value. The voltage, V$_{track}$, at the positive input of the second comparator 2102b then commences to ramp up, which triggers the second comparator 2102b to change state. This in turn closes the second switch 2106b and the I current source 2108b commences to sink a current I. Hence, for the "half-pulse" period, the capacitor 2110 is effectively charged by a current of I. At the end of the "half-pulse" period, the first switch 2106a opens while the second switch 2106b remains closed, and the I current source 2108b continues to discharge the capacitor 2110 with a current I. Subsequently, V$_{track}$ ramps down until it reaches its initial voltage, which then triggers the second comparator 2102b to open the second switch 2106b. In this manner, the width of the final PWM pulse, V$_{M1}$, as generated is twice that of V$_{half-pulse}$.

From FIG. 12b, it can be seen that the centre of the final PWM signal V$_{M1}$ is synchronised with the centre of the carrier signal, and is independent of the amplifier input signal. Hence the PWM signal V$_{M1}$ has zero phase error, i.e. phase-error-free. Further, as a rising edge of the PWM signal V$_{M1}$ coincides with that of the conventional natural-sampling PWM signal, and since the sampling is not synchronised by any clock signals, the sampling may thus so be considered as natural sampling [26]. The PWM signal V$_{M1}$ is therefore the desired natural sampling phase-error-free PWM signal. For completeness, the centre of the conventional PWM waveform, V$_{M1(conv)}$, is not synchronized to the carrier, but rather, dependent on the magnitude of the amplifier input signal (which thus results in phase-error [4]).

B. Proposed Input-Modulated Carrier Generator

As discussed, the carrier's frequency f$_{sw}$ (generated by the carrier generator 1704) is not fixed, unlike in conventional designs. Rather, the carrier's frequency f$_{sw}$ is input-modulated and hence is varying.

Figure 13:
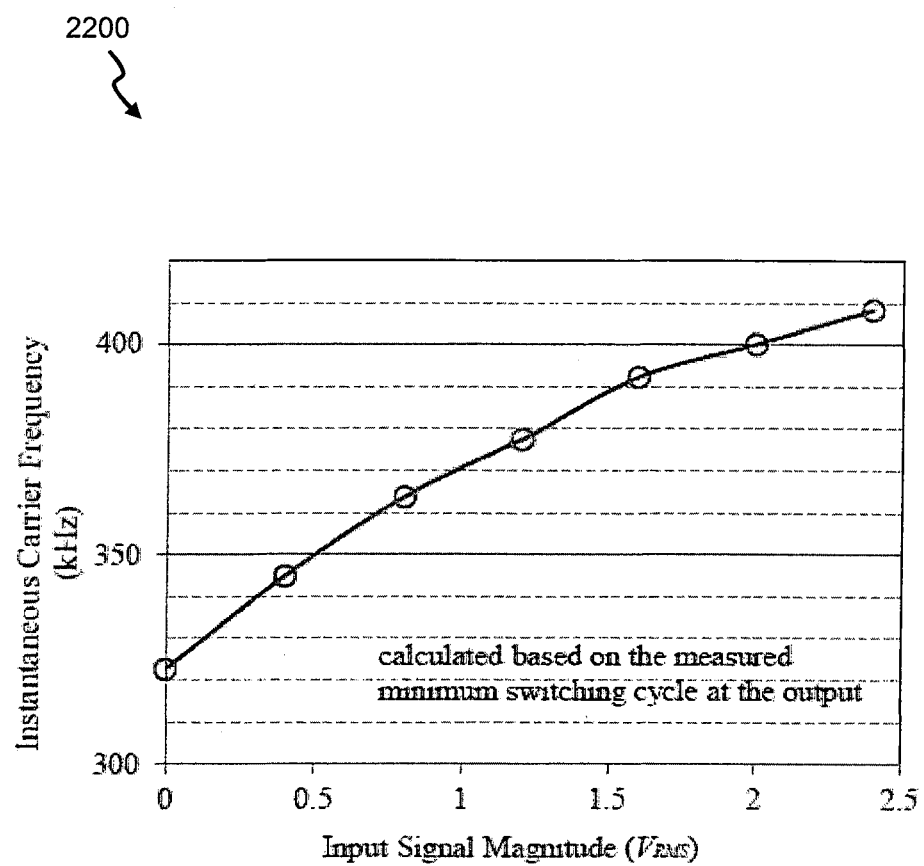
FIG. 13 is a performance evaluation graph for the amplifier of FIG. 11a, in terms of instantaneous switching frequency versus input signal magnitude (with $V_{DD}$ configured at 3.6V)

Operation of the carrier generator 1704 is generally same as that described for the carrier generator 106 of the first embodiment, and hence not repeated for brevity. It is to be appreciated that the input-modulated carrier signal features a minimum switching frequency of about 320 kHz, and with increased input signal magnitude, the (instantaneous) switching frequency ramps up to about 420 kHz. FIG. 13 is a performance evaluation graph 2200 for the third amplifier 1700, which demonstrates the relationship between input signal magnitude and instantaneous switching frequency. The varying switching frequency leads to the spread-spectrum [8], which may potentially reduce the EMI of the third amplifier 1700.

3.3 Measurement Results

For purpose of performance evaluation, an IC prototype (not shown) of the third amplifier 1700 is fabricated using a commercial 65 nm CMOS process and for cost reasons, integrated with other (unrelated) designs on a 3×3 mm$^2$ die (in which the active area is about 0.6 mm$^2$). In this section, reference to the third amplifier 1700 includes a reference to the IC prototype thereof.

In the performance evaluation, it is highlighted that a single-rail power supply with V$_{DD}$ configured at 3.6 V and an 8 O load (unless specified otherwise) are used. Measurements are obtained by means of the Rohde & Schwarz UPV Audio analyser. The measured bandwidth of the third amplifier 1700 is from 20 Hz to 20 kHz. The measurements setup adopted comply with testing settings described in a well-established literature [27]. To ascertain the PSRR and PS-IMD parameters, a power supply that is able to superimpose a sinusoidal wave on a DC voltage is used to inject the noise in the supply voltage.

Figure 14:
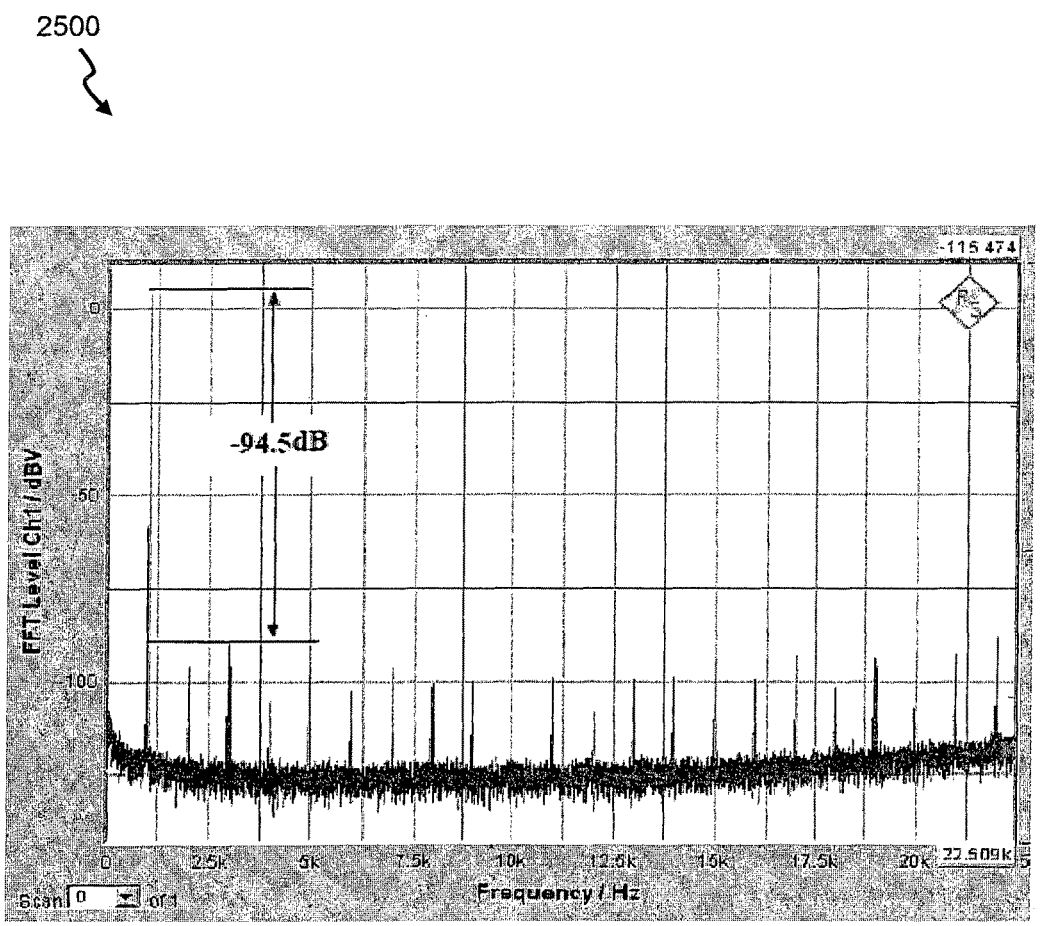
FIG. 14 a spectrum graph of an output signal generated by the amplifier of FIG. 11a, with $V_{out}$ measured as 2 $V_{rms}$ at 1 kHz.

FIG. 14 a spectrum graph 2500 of an output signal generated by the third amplifier 1700, with V$_{out}$ measured to be 2 V$_{rms}$ with f$_{out}$ at 1 kHz. It is observed that the dominant 3$^{rd}$-order harmonic is greater than 94 dB which is lower than the 1 kHz fundamental component, and the measured THD+N and SNR are 0.0027% and about 97 dB respectively.

Figure 15:
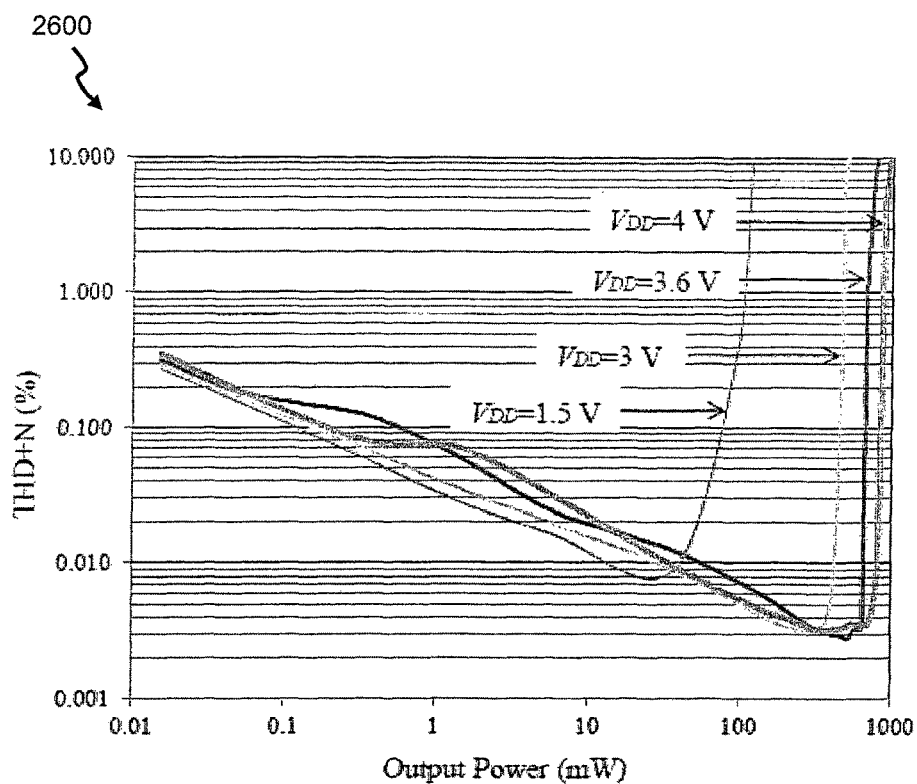
FIG. 15 is a performance evaluation graph for the amplifier of FIG. 11a, in terms of THD+N versus output power at different voltage supplies, when driving an 8 O load at $f_{in}$ set to 1 kHz.

FIG. 15 is a performance evaluation graph 2600 for the third amplifier 1700, in terms of THD+N versus output power at different voltage supplies, when driving an 8 O load with $f_{in}$ set to 1 kHz. It is determined that the minimum THD+N is a low 0.0027% when the output power is at 500 mW. When the output power increases to about 700 mW, the THD+N nevertheless continue to be low at less than 0.01%.

Based on the adopted design, the third amplifier 1700 is able to operate over a large range of supply voltages, ranging from 1.2 V to 4 V. This versatility is important for an envisaged application intended, where devices (incorporating the third amplifier 1700) are powered by a rechargeable 1.2 V single-cell battery and for meeting stringent power requirements where there is no voltage regulation (i.e. refer to the PSRR performance evaluation in FIG. 17).

Figure 16:
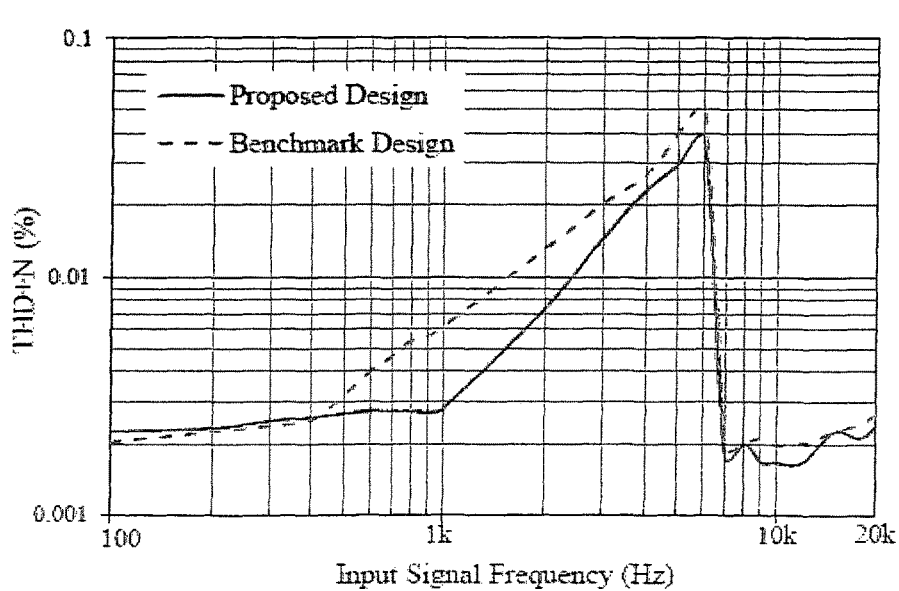
FIG. 16 is a performance evaluation graph of a benchmark design and the amplifier of FIG. 11a, in terms of THD+N versus input signal frequency, when delivering a power of 500 mW to an 8 O load.

FIG. 16 is a further performance evaluation graph 2700 of the third amplifier 1700, in terms of THD+N versus input signal frequency, when delivering an output power of 500 mW to an 8 O load. In particular, the third amplifier 1700 features excellent THD+N performance over a wide range of input frequencies, including THD+N measured to be 0.0022% at 100 Hz and THD+N measured to be at 0.0027% at 1 kHz.

Figure 17:
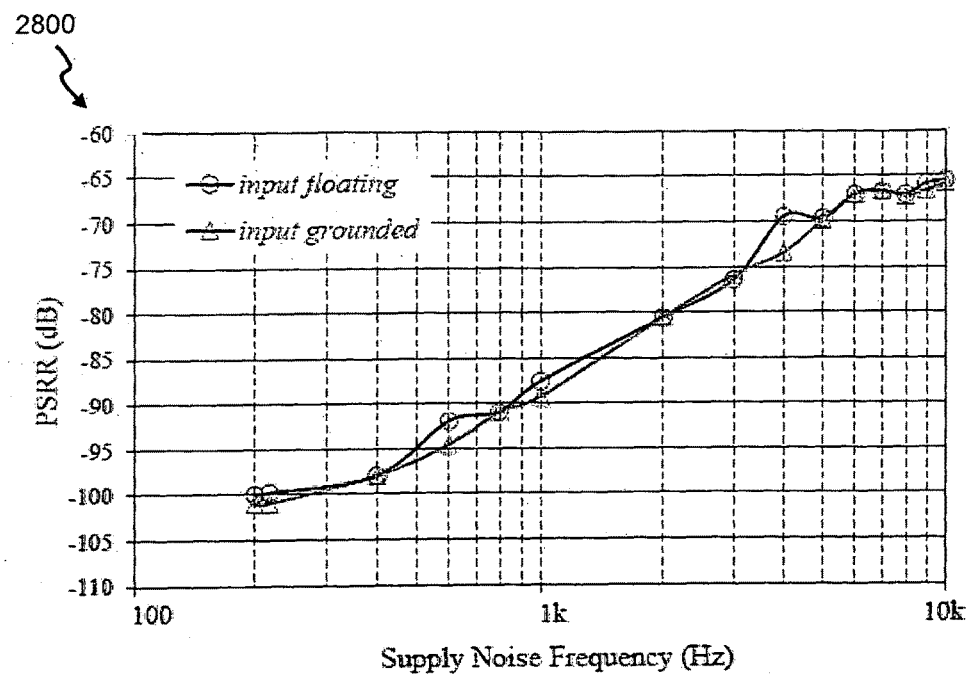
FIG. 17 is a performance evaluation graph for the amplifier of FIG. 11a, in terms of PSRR versus supply noise frequency (with $V_{DD}$ configured at 3.6 V and $V_{ripple}$ set to 200 $mV_{pp}$)

For PSRR measurements, a noise signal (with $V_{ripple}$ set to 200 $mV_{pp}$) at different frequencies is superimposed on the single-rail power supply (with $V_{DD}$ at 3.6 V) and the input of the third amplifier 1700 is configured electrically grounded/floating. Accordingly, FIG. 17 is a related performance evaluation graph 2800, in terms of PSRR versus supply noise frequency. Of specific interest, the PSRR measured is very high at 217 Hz and 1 kHz, being about 101 dB and 90 dB respectively. It is to be appreciated that the PSRR is largely independent of whether the input is grounded or floating. The PSRR at the two frequencies of 217 Hz and 1 kHz are particularly important for mobile applications as radio frequency power amplifiers used in mobile devices may induce large magnitude supply noise at 217 Hz and 1 kHz when transmitting GSM and LTE signals respectively.

Figure 18:
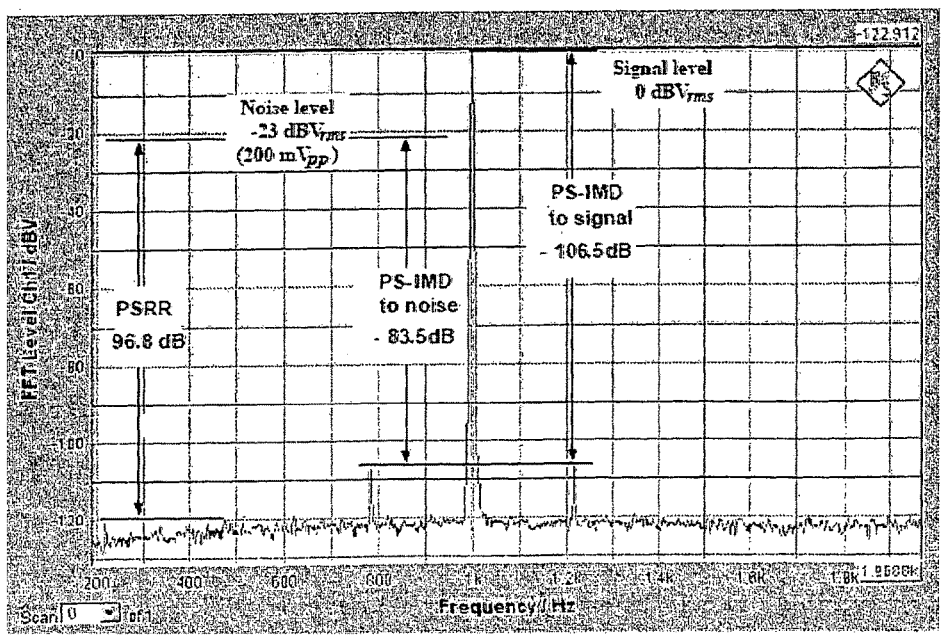
FIG. 18 is a spectrum graph of an output signal generated by the amplifier of FIG. 11a, with $V_{out}$ measured as 1 $V_{rms}$ at 1 kHz, when $V_{DD}$ is configured at 3.6 V and $V_{ripple}$ is set to 200 $mV_{pp}$ (i.e. −23 dB $V_{rms}$) at 217 Hz.

In addition to PSRR, PS-IMD is another important parameter [16, 21, 28] to qualify the supply noise rejection attributes of CDAs. FIG. 18 shows a spectrum graph 2900 of an output signal generated by the third amplifier 1700, with $V_{out}$ measured as 1 $V_{rms}$ at 1 kHz, when $V_{DD}$ is set to 3.6 V and $V_{ripple}$ is set to 200 $mV_{pp}$ (i.e. −23 dB $V_{rms}$) at 217 Hz. From FIG. 18, it is seen that the PS-IMDs with respect to the output signal and the noise are very low, at −106.5 dB and −83.5 dB respectively. To ascertain the PSRR for a practical situation, the PSRR is measured for $V_{out}$ equal to 1 $V_{rms}$, and accordingly it is determined that the PSRR remains at a high of 96.8 dB.

Figure 19:
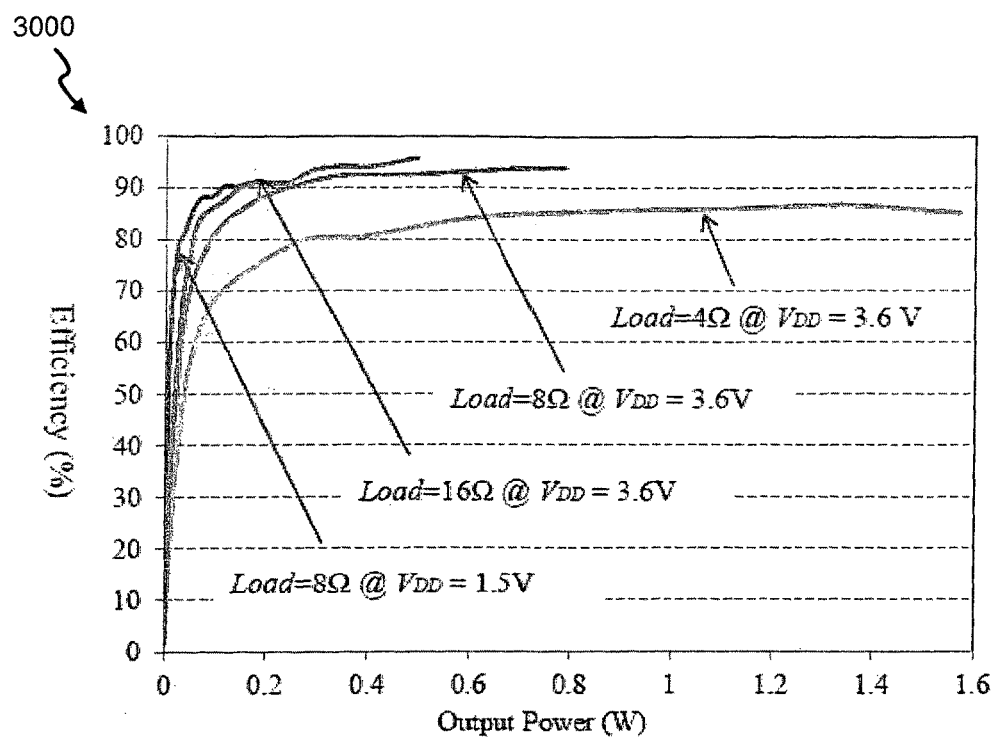
FIG. 19 is a performance evaluation graph between a benchmark design and the amplifier of FIG. 11a, in terms of efficiency versus output power with different loads and supply voltages.

FIG. 19 is another performance evaluation graph 3000 depicting the power-efficiency of the third amplifier 1700 when driving different loads from different power supplies. Based on measurements, the power-efficiency is a high 94% when delivering about 0.8 W of output power to an 8 O load. With a 4 O load, the efficiency remains a high 85% when delivering about 1.6 W of output power.

From FIG. 19, the maximum output power is defined when THD+N=10%. For completeness, the total power consumption (used to calculate power-efficiency) includes all components of the third amplifier 1700 shown in FIG. 11a (and also any biasing circuits not shown therein).

Figure 20:
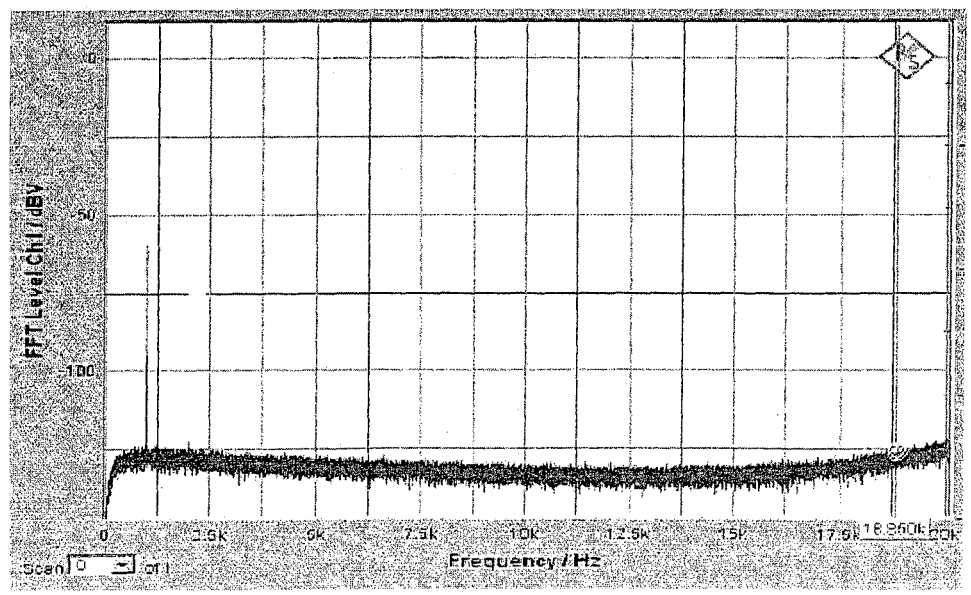
FIG. 20 is a spectrum graph of an output signal generated by the amplifier of FIG. 11a, with $V_{out}$ measured as 1 $mV_{rms}$ at 1 kHz.

FIG. 20 shows a spectrum graph 3100 of an output signal generated by the third amplifier 1700, with $V_{out}$ measured as 1 $mV_{rms}$ at 1 kHz. It may be seen from FIG. 20 that the noise floor of the third amplifier 1700 is low, and the A-weighted integrated noise from 20 Hz to 20 kHz is about 35 µV.

Overall, the third amplifier 1700 (realised using a 65 nm CMOS process for the evaluations) achieved a THD+N of 0.0027% and a power-efficiency of 94% when delivering 500 mW of outpower to an 8 O load from a power supply with $V_{DD}$ set to 3.6 V. The PSRR of the third amplifier 1700 was measured to be 101 dB at 217 Hz and 90 dB at 1 kHz, and the switching frequency was input-modulated with relatively low nominal of about 320 kHz to 420 kHz, potentially reducing the EMI due to effect of spread spectrum. The third amplifier 1700 also features a versatile supply voltage operating range with functionality for $V_{DD}$ ranging from a rechargeable single-cell battery of 1.2 V to a standard voltage of 3.6 V (typically configured in modern smart-devices).

The measurement results above discussed for the third amplifier 1700 are summarised in a table 3200 of FIG. 21, and are also shown benchmarked against several conventional designs; for completeness other imperative parameters are also included in the table 3200. The conventional designs are grouped based on the packaging types adopted, i.e. by lead-frame packages (e.g. QFN, QFP package) and non-lead-frame-packages (e.g. wafer-level CSP package). It is to be highlighted that the CDAs listed in the two rightmost columns of the table 3200 are commercially marketed products.

From FIG. 21, it may be observed that the third amplifier 1700 features the highest PSRR in relation to all the conventional designs. Specifically, the THD+N of the third amplifier 1700 is a low 0.0027% (when delivering 500 mW of output power) and is also much lower compared to all (except for two of) the conventional designs. The power-efficiency of the third amplifier 1700 is a high 94% and is the highest of all the designs benchmarked. It is to be noted that, among all the designs in FIG. 21, the third amplifier 1700 is the only CDA that is operable with a supply voltage as low as 1.2 V and therefore is able to operate from a single rechargeable battery cell. Hence, the third amplifier 1700 has the highest PSRR, highest power-efficiency, very-low THD+N, and wide $V_{DD}$ operating voltage range. That is, the overall performance of the third amplifier 1700 triumph existing state-of-the-art designs.

4. Summary

In summary, the first amplifier 100 (arranged to generate a Signal-Modulated PWM signal), the second amplifier 1000 (arranged to generate a phase-adjusted PWM signal or optionally both a Signal Modulated PWM signal and a phase-adjusted PWM signal, depending on a configuration adopted) and the third amplifier 1700 (arranged to generate both Signal Modulated PWM signal and phase-adjusted PWM signal) are proposed, which attained simultaneous improved performance in the following areas: THD+N, PSRR and EMI. Based on measurements made on prototypes for the first/second/third amplifiers 100, 1000, 1700 (implemented as a non-Flip-Chip package in the QFN format) and simulations performed, it is determined that either amplifier 100, 1000 is able to simultaneously improve performance for the THD+N (i.e. THD<−80 dB) and PSRR (i.e. PSRR>80 dB) to provide a CDA with "very-high-quality" attributes. Further, when implemented in a Flip-Chip package, any of the proposed amplifiers 100, 1000, 1700 is also able to significantly improve performance for the THD+N (i.e. THD+N<−100 dB) and PSRR (i.e. PSRR>100 dB) to provide a CDA with "ultra-high-quality" attributes, which similarly are realisable (and independent of any package format adopted) if the first/second/third amplifier 100, 1000, 1700 is instead fabricated using the integrated CMOS on III-V process.

Moreover, combining the designs in respect of Signal Modulated PWM and phase-adjusted PWM to arrive at the third amplifier 1700 also provides for a more robust design as well. It is to be noted that conventional CDAs (implemented as a non-Flip-Chip package) are unable to simultaneously provide THD+N<-80 dB and PSRR>80 dB and also conventional CDAs (implemented as a non-Flip-Chip package or Flip-Chip package) are unable to simultaneously attain THD+N<-100 dB and PSRR>100 dB. While the hardware complexity and power dissipation of the proposed amplifiers 100, 1000, 1700 are slightly higher compared to conventional CDAs, the increased hardware complexity and power dissipation are however determined to be negligible (i.e. less than 1% of the overall overheads of the proposed amplifiers 100, 1000, 1700). In other words, there are no major disadvantages/limitations to the proposed amplifiers 100, 1000, 1700.

It will be appreciated by now that the proposed amplifiers 100, 1000, 1700 are of high power-efficiency, ultra-high-fidelity, ultra-noise-immunity, and of low EMI. Hence an application of the proposed amplifiers 100, 1000, 1700 would be as Class D audio amplifiers (whether implemented as a discrete component, or as a system-on-chip), which may find wide usage in ubiquitous consumer electronic devices, such as smartphones, tablets, TVs, audio amplifiers, radios and etc. It is to be appreciated that the commercial market for those devices in 2012 was estimated to be worth about two billion devices.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, amplifier input signals need not necessarily be filtered and amplified (by the integrators-and-filters circuit 104) before being provided to the PWM 102/phase-adjusting PWM 1002/first and second phase-adjusting pulse width modulators 1702a, 1702b, if there is no such requirement based on a design adopted for an associated amplifier. That is, the amplifier input signals can be provided straight to the PWM 102/phase-adjusting PWM 1002/first and second phase-adjusting pulse width modulators 1702a, 1702b without being filtered and amplified. So it is to be appreciated that the modulator input signals as afore described in the method 300 of FIG. 3, and the method 1400 of FIG. 9 may or may not be filtered and amplified. Further, it is to be appreciated that the proposed amplifiers 100, 1000, 1700 are not restricted to being fabricated using only the CMOS process; other suitable fabrication processes are also possible.

Further, it is to be appreciated that the proposed amplifiers 100, 1000, 1700 are not restricted to be in a differential configuration and they may instead be arranged in single-ended configuration. In such a single-ended configuration, the pulse width modulator 102 of the first and third amplifiers 100, 1700 may require only one comparator. Correspondingly, for the respective sample-and-hold circuit arrangements 1102, 1202 of the first and second implementation variations of the phase-adjusting PWM 1002a, 1002b, the sample-and-hold circuit arrangement 1102, 1202 may include only one S/H module and one comparator. Also, for the third implementation variation of the phase-adjusting PWM 1002c, the half-pulse-doubling circuit arrangement 1302 may include only one half pulse generator and one pulse doubler in this instance.

REFERENCES

[1]. A. Matamura, N. Nishimura, and L. Bill Yang, "Filter-less multi-level delta-sigma Class D amplifier for portable applications," in IEEE International Symposium on Circuits and Systems, 2009, pp. 1177-1180.

[2]. M. A. Rojas-Gonzalez and E. Sanchez-Sinencio, "Two Class D audio amplifiers with 89/90% efficiency and 0.02/0.03% THD+N consuming less than 1 mW of quiescent power," in ISSCC Dig. Tech. Papers, 2009, pp. 450-451.

[3]. T. Ge and J. S. Chang, "Bang-Bang Control Class D Amplifiers: Total Harmonic Distortion and Supply Noise," IEEE Transactions on Circuits and Systems I: Regular Papers, vol. 56, pp. 2353-2361, 2009.

[4]. W. Shu and J. S. Chang, "THD of Closed-Loop Analog PWM Class D Amplifiers," IEEE Transactions on Circuits and Systems I: Regular Papers, vol. 55, pp. 1769-1777, 2008.

[5]. J. Lu and R. Gharpurey, "Design and Analysis of a Self-Oscillating Class D Audio Amplifier Employing a Hysteretic Comparator," IEEE Journal of Solid-State Circuits, vol. 46, pp. 2336-2349, 2011.

[6]. M. Teplechuk, T. Gribben, and C. Amadi, "Filterless integrated Class D audio amplifier achieving 0.0012% THD+N and 96 dB PSRR when supplying 1.2 W," in ISSCC Dig. Tech. Papers, 2011, pp. 240-242.

[7]. Y. Choi, W. Tak, Y. Yoon, J. Roh, S. Kwon, and J. Koh, "A 0.018% THD+N, 88-dB PSRR PWM Class D Amplifier for Direct Battery Hookup," IEEE Journal of Solid-State Circuits, vol. 47, pp. 454-463, 2012.

[8]. A. Nagari, E. Allier, F. Amiard, V. Binet, and C. Fraisse, "An 8 O 2.5 W 1%-THD 104 dB(A)-dynamic-range Class D audio amplifier with an ultra-low EMI system and current sensing for speaker protection," in ISSCC Dig. Tech. Papers, 2012, pp. 92-94.

[9]. Wei Shu and J. S. Chang, "IMD of Closed-Loop Filterless Class D Amplifiers," IEEE Trans. Circuits and Systems I: Fundamental Theory and Applications, Vol. 75, No. 2, pp. 518-527, February 2010.

[10]. Victor Adrian, J. S. Chang, and B. H. Gwee, "A Low Voltage Micropower Digital Class D Amplifier Modulator for Hearing Aids," IEEE Trans. Circuits and Systems I: Fundamental Theory and Applications, Vol. 55, Issue 6, pp. 1769-1777, July 2008.

[11]. Wei Shu and J. S. Chang, "Power Supply Noise in Analog Audio Class D Amplifiers," IEEE Trans. Circuits and Systems I: Fundamental Theory and Applications, Vol. 56, No. 1, pp. 84-96, January 2009.

[12]. T. Ge and J. S. Chang, "Bang-bang Control Class D Amplifiers," IEEE Trans. on Circuits and Systems II, vol. 55, pp. 723-727, August 2008.

[13]. A. Bandyopadhyay, M. Determan, K. Sejun, and N. Khiem, "A 120 dB-SNR 100 dB-THD+N 21.5 mW/channel multibit CT sigma-delta DAC," in *ISSCC Dig. Tech. Papers,* 2011, pp. 482-483.

[14]. W. Minsheng, J. Xicheng, S. Jungwoo, and T. L. Brooks, "A 120 dB Dynamic Range 400 mW Class-D Speaker Driver With Fourth-Order PWM Modulator," *Solid-State Circuits, IEEE Journal of,* vol. 45, pp. 1427-1435, 2010.

[15]. "AD1852—Stereo, 24-Bit, 192 kHz, Multibit, Sigma-Delta DAC," Analog Devices, 2009.

[16]. T. Ge and J. S. Chang, "Modeling and Technique to Improve PSRR and PS-IMD in Analog PWM Class-D Amplifiers," *IEEE Transactions on Circuits and Systems II: Express Briefs*, vol. 55, pp. 512-516, 2008.

[17]. Y. Choi, W. Tak, Y. Yoon, J. Roh, S. Kwon, and J. Koh, "A 0.018% THD+N, 88-dB PSRR PWM Class-D Amplifier for Direct Battery Hookup," *IEEE Journal of Solid-State Circuits*, vol. 47, pp. 454-463, 2012.

[18]. "SSM2315—Filterless, High Efficiency, Mono 3 W Class-D Audio Amplifier," Analog Devices, 2008.

[19]. "TPA2037D1—3.2 W Mono Class-D Audio Power Amplifier With 6-dB Gain and Auto Short-Circuit Recovery," Texas Instruments, 2010.

[20]. K. Sunwoo, K. Injeong, Y. Shinyoung, K. Sangheyub, L. Sangheon, H. Taeho, et al., "A 0.028% THD+N, 91% power-efficiency, 3-level PWM Class-D amplifier with a true differential front-end," in *ISSCC Dig. Tech. Papers*, 2012, pp. 96-98.

[21]. M. A. Teplechuk, T. Gribben, and C. Amadi, "True Filterless Class-D Audio Amplifier," *IEEE Journal of Solid-State Circuits*, vol. 46, pp. 2784-2793, 2011.

[22]. J. Lu and R. Gharpurey, "Design and Analysis of a Self-Oscillating Class D Audio Amplifier Employing a Hysteretic Comparator," *IEEE Journal of Solid-State Circuits*, vol. 46, pp. 2336-2349, 2011.

[23]. J. S. Chang, M. T. Tan, Z. Cheng, and Y.-C. Tong, "Analysis and design of power efficient class D amplifier output stages," *IEEE Transactions on Circuits and Systems I: Fundamental Theory and Applications*, vol. 47, pp. 897-902, 2000.

[24]. P. Balmelli, J. M. Khoury, E. Viegas, P. Santos, V. Pereira, J. Alderson, et al., "A Low-EMI 3-W Audio Class-D Amplifier Compatible With AM/FM Radio," *Solid-State Circuits, IEEE Journal of*, vol. 48, pp. 1771-1782, 2013.

[25]. T. Ge, J. S. Chang, and W. Shu, "Modeling and analysis of PSRR in analog PWM class D amplifiers," IEEE International Symposium on Circuits and Systems, pp. 1386-1389, May 2006.

[26]. H. S. Black, "Modulation Theory," ed Princeton, N.J.: Van Nostrand, 1953, pp. 263-281.

[27]. "SLOA068—Guidelines for Measuring Audio Power Amplifier Performance," Texas Instruments, 2001.

[28]. J. Torres, A. Colli-Menchi, M. A. Rojas-Gonzalez, and E. Sanchez-Sinencio, "A Low-Power High-PSRR Clock-Free Current-Controlled Class-D Audio Amplifier," *IEEE Journal of Solid-State Circuits*, vol. 46, pp. 1553-1561, 2011.

[29]. M. A. Rojas-Gonzalez and E. Sanchez-Sinencio, "Low-Power High-Efficiency Class D Audio Power Amplifiers," *IEEE Journal of Solid-State Circuits*, vol. 44, pp. 3272-3284, 2009.

The invention claimed is:

1. A method of generating a phase-adjusted pulse width modulation (PWM) signal for an analog amplifier, the amplifier arranged to receive an amplifier input signal, the method comprising:
   (i) receiving a modulator input signal, which is associated with the amplifier input signal;
   (ii) using the modulator input signal to modulate a carrier to produce a PWM signal having a series of pulses; and
   (iii) adjusting the pulses of the PWM signal to produce the phase-adjusted PWM signal, the phase-adjusted PWM signal including a series of phase-adjusted pulses with each phase-adjusted pulse defined by a pair of changing edges and a pulse center, the pulse center of each phase-adjusted pulse being fixed relative to a respective center of the carrier, and with one of the changing edges being synchronized to a triggering edge of the PWM signal.

2. The method according to claim 1, wherein the pulse center of each phase-adjusted pulse is in registration with the respective center of the carrier.

3. The method according to claim 1, wherein the fixed relative position between the pulse center of each phase-adjusted pulse and the respective center of the carrier includes a constant time delay which is independent of the magnitude of the input signal.

4. A pulse width modulator for generating a phase-adjusted pulse width modulation (PWM) signal for an analog amplifier, the amplifier arranged to receive an amplifier input signal, the pulse width modulator comprising:
   (i) a modulator input for receiving a modulator input signal, which is associated with the amplifier input signal,
   (ii) a modulator for modulating a carrier with the modulator input signal to produce a PWM signal having a series of pulses, and
   (iii) a pulse circuit for adjusting the pulses of the PWM signal to produce the phase-adjusted PWM signal, the phase-adjusted PWM signal including a series of phase-adjusted pulses with each phase-adjusted pulse defined by a pair of changing edges and a pulse center, the pulse center of each phase-adjusted pulse being fixed relative to a respective center of the carrier, and with one of the changing edges being synchronized to a triggering edge of the PWM signal.

5. The pulse width modulator according to claim 4, wherein the pulse center of each phase-adjusted pulse is in registration with the respective center of the carrier.

6. The pulse width modulator according to claim 4, wherein the fixed relative position between the pulse center of each phase-adjusted pulse and the respective center of the carrier includes a constant time delay which is independent of the magnitude of the input signal.

7. The pulse width modulator according to claim 4, wherein the modulator includes at least a first comparator configured to modulate the carrier with the modulator input signal to produce the PWM signal.

8. The pulse width modulator according to claim 7, wherein the modulator further includes at least one sample-and-hold device arranged to receive signals from the first comparator, and a second comparator arranged to receive signals from the sample-and-hold device.

9. The pulse width modulator according to claim 8, wherein the second comparator is arranged to produce the phase-adjusted PWM signal.

10. The pulse width modulator according to claim 8, wherein the modulator further includes at least a pulse combining circuit arranged to receive signals from the first and second comparators to produce the phase-adjusted PWM signal.

11. The pulse width modulator according to claim 7, wherein the modulator further includes at least one half pulse generator arranged to receive signals from the first comparator, and at least one pulse doubler arranged to receive signals from the half pulse generator to produce the phase-adjusted PWM signal.

12. An analog amplifier comprising:
   a pulse width modulator for generating a phase-adjusted pulse width modulation (PWM) signal for the amplifier, the pulse width modulator including (i) a modulator input for receiving a modulator input signal, which is associated with an amplifier input signal of the amplifier, (ii) a modulator for modulating a carrier with the modulator input signal to produce a PWM signal having a series of pulses, and (iii) a pulse circuit for adjusting the pulses of the PWM signal to produce the phase-adjusted PWM signal, the phase-adjusted PWM signal including a series of phase-adjusted pulses with each phase-adjusted pulse defined by a pair of changing edges and a pulse center, the pulse center of each phase-adjusted pulse being fixed relative to a respective center of the carrier, and with one of the changing edges being synchronized to a triggering edge of the PWM signal.

13. The analog amplifier according to claim 12, wherein the amplifier is a Class D analog amplifier.

14. The analog amplifier according to claim 12, further comprising an integrator and filter circuit arranged to filter the amplifier input signal to produce the modulator input signal.

15. The analog amplifier according to claim 12, further comprising a carrier generator arranged to generate the carrier.

* * * * *